US012562720B2

(12) United States Patent
Xian et al.

(10) Patent No.: US 12,562,720 B2
(45) Date of Patent: Feb. 24, 2026

(54) METHOD OF FORMING SEMICONDUCTOR DEVICE INCLUDING DAISY-CHAINED DELAY CELLS

(71) Applicants: TAIWAN SEMICONDUCTOR MANUFACTURING COMPANY, LTD., Hsinchu (TW); TSMC NANJING COMPANY, LIMITED, Nanjing (CN)

(72) Inventors: Huaixin Xian, Hsinchu (TW); Longbiao Lei, Hsinchu (TW); Senpei Goa, Hsinchu (TW); Zhang-Ying Yan, Hsinchu (TW); Qingchao Meng, Hsinchu (TW); Jerry Chang Jui Kao, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 0 days.

(21) Appl. No.: 18/739,876

(22) Filed: Jun. 11, 2024

(65) Prior Publication Data
US 2024/0333268 A1 Oct. 3, 2024

Related U.S. Application Data

(62) Division of application No. 17/822,559, filed on Aug. 26, 2022, now Pat. No. 12,015,410.

(30) Foreign Application Priority Data

Aug. 15, 2022 (CN) .......................... 202222144042.5

(51) Int. Cl.
*H03K 3/00* (2006.01)
*H03K 3/037* (2006.01)
(Continued)

(52) U.S. Cl.
CPC ............. *H03K 3/86* (2013.01); *H03K 3/0375* (2013.01); *H03K 3/356113* (2013.01)

(58) Field of Classification Search
CPC ... H03K 3/86; H03K 3/0375; H03K 3/356113
See application file for complete search history.

(56) References Cited

U.S. PATENT DOCUMENTS 11,362,667 B1 * 6/2022 Futamura .............. H03L 7/0891
2005/0280031 A1 * 12/2005 Yano ................. H01L 27/11807
257/210

(Continued)

FOREIGN PATENT DOCUMENTS

TW 202125774 7/2021
TW 1773625 8/2022

*Primary Examiner* — Tuan T Lam

(74) *Attorney, Agent, or Firm* — Hauptman Ham, LLP

(57) ABSTRACT
A method of forming a semiconductor device includes forming a first row of transistors extending in a first direction and including dummy transistors and active transistors. The first row includes, in a sequence from a first end to a second end, at least a first dummy group, a first delay cell, a second delay cell, and a second dummy group. The first dummy group is formed of one or more dummy transistors. The second dummy group is formed of one or more dummy transistors. The first delay cell is formed of active transistors configured as a basic inverter and a float-resistant inverter. The second delay cell is formed of active transistors configured as at least one inverter. The first row is free of dummy transistors between the first delay cell and the second delay cell.

20 Claims, 24 Drawing Sheets

(51) Int. Cl.
   *H03K 3/356*     (2006.01)
   *H03K 3/86*      (2006.01)

(56)                References Cited

U.S. PATENT DOCUMENTS

| | | | |
|---|---|---|---|
| 2009/0007044 A1 | 1/2009 | Shibuya et al. | |
| 2018/0287593 A1 | 10/2018 | Tsai et al. | |
| 2021/0384186 A1 | 12/2021 | Kim et al. | |
| 2022/0075564 A1 | 3/2022 | Moon et al. | |
| 2022/0375920 A1* | 11/2022 | Xian | .................... H01L 27/092 |
| 2023/0022333 A1 | 1/2023 | Chang et al. | |
| 2023/0110560 A1 | 4/2023 | Shen et al. | |

* cited by examiner

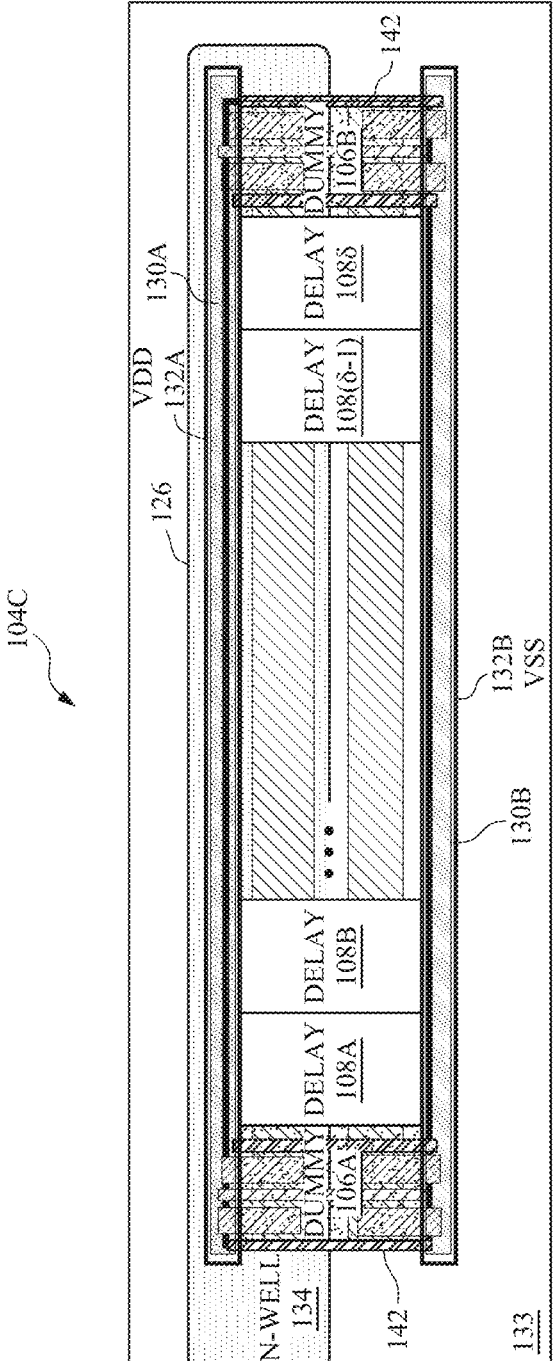
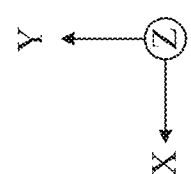
Fig. 1C
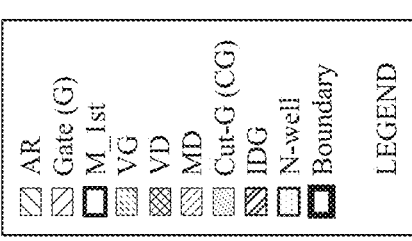

304A

352A

352B

352C

Y

Z

X

| DELAY 308L | DELAY 308K | DELAY 308J | DELAY 308I |
| DELAY 308H | DELAY 308G | DELAY 308F | DELAY 308E |
| DELAY 308D | DELAY 308C | DELAY 308B | DELAY 308A |

VDD

N-well 334

VSS

N-well 334

VDD

VSS

LEGEND

AR
Gate (G)
M_1st
VG
VD
MD
Cut-G (CG)
IDG
N-well
Boundary

404A

Y ← Z
↓
X

452D

452A

452B

452C

VSS

VDD
N-well
334

VSS

VDD
N-well
334

VSS

DELAY
408H

DELAY
408G

DELAY
408F

DELAY
408E

DELAY
408D

DELAY
408C

DELAY
408B

DELAY
408A

AR
Gate (G)
M_1st
VG
VD
MD
Cut-G (CG)
IDG
N-well
Boundary

LEGEND

404B

454A
Dummy row

452A
Delay row

452B
Delay row

452C
Delay row

452D
Delay row

454B
Dummy row

VSS

VDD
N-well
334

VSS

VDD
N-well
334

VSS

VDD
N-well
334

VSS

DELAY
408E

DELAY
408F

DELAY
408C

DELAY
408D

DELAY
408A

DELAY
408B

DELAY
408G

DELAY
408H

AR
Gate (G)
M_1st
VG
VD
MD
Cut-G (CG)
IDG
N-well
Boundary
LEGEND

502
GENERATE LAYOUT DIAGRAM

504
MANUFACTURE SEMICONDUCTOR DEVICE
BASED ON LAYOUT DIAGRAM

500A

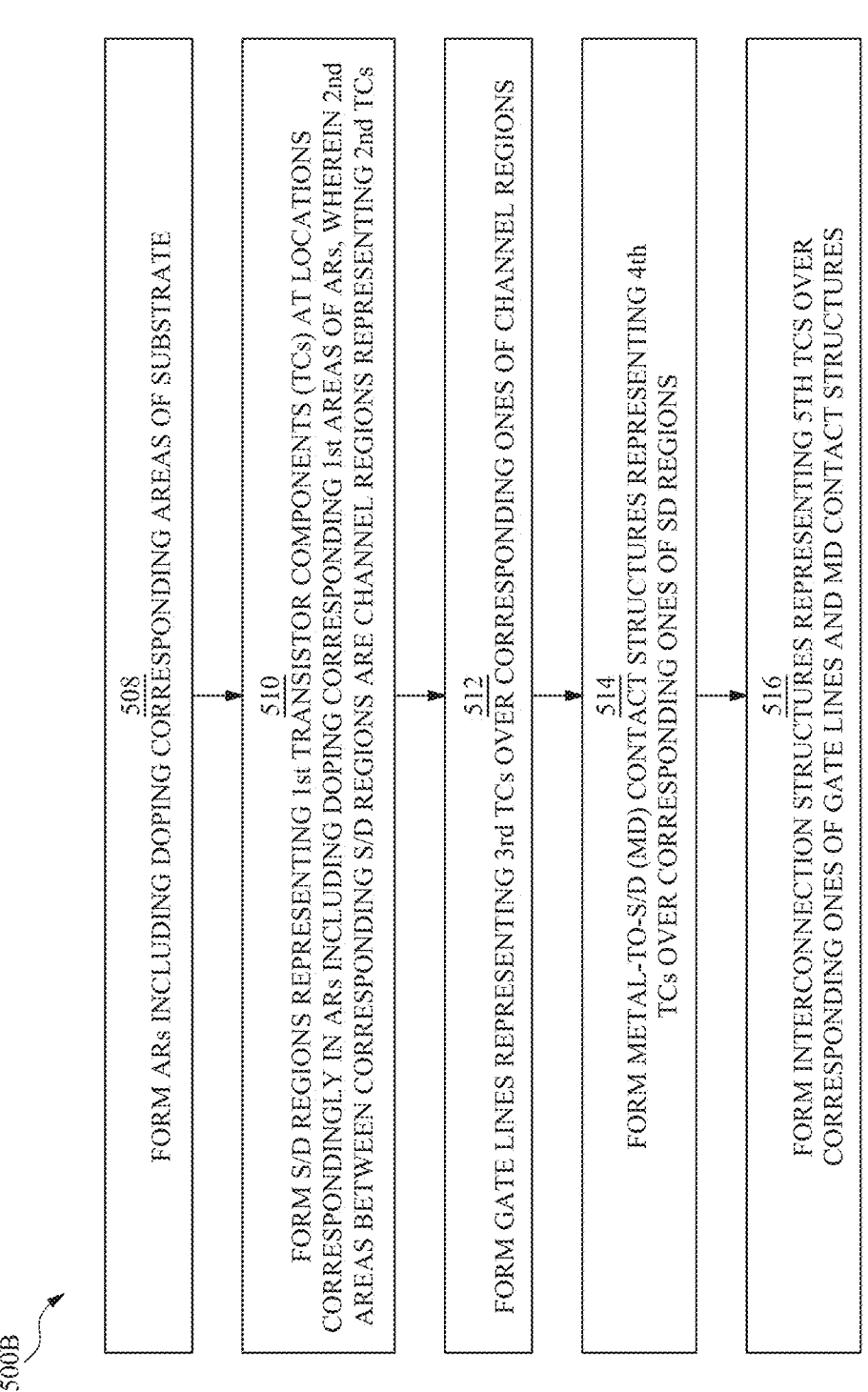

500B

508
FORM ARs INCLUDING DOPING CORRESPONDING AREAS OF SUBSTRATE

510
FORM S/D REGIONS REPRESENTING 1st TRANSISTOR COMPONENTS (TCs) AT LOCATIONS CORRESPONDINGLY IN ARs INCLUDING DOPING CORRESPONDING 1st AREAS OF ARs, WHEREIN 2nd AREAS BETWEEN CORRESPONDING S/D REGIONS ARE CHANNEL REGIONS REPRESENTING 2nd TCs

512
FORM GATE LINES REPRESENTING 3rd TCs OVER CORRESPONDING ONES OF CHANNEL REGIONS

514
FORM METAL-TO-S/D (MD) CONTACT STRUCTURES REPRESENTING 4th TCs OVER CORRESPONDING ONES OF SD REGIONS

516
FORM INTERCONNECTION STRUCTURES REPRESENTING 5TH TCS OVER CORRESPONDING ONES OF GATE LINES AND MD CONTACT STRUCTURES

Fig. 5B

METHOD OF FORMING SEMICONDUCTOR DEVICE INCLUDING DAISY-CHAINED DELAY CELLS

PRIORITY

This application is a division of U.S. patent application Ser. No. 17/822,559, filed Aug. 26, 2022, now U.S. Pat. No. 12,015,410, which claims priority to China Application No. 202222144042.5, filed Aug. 15, 2022, all of which are incorporated herein by reference in their entireties.

BACKGROUND

The integrated circuit (IC) industry produces a variety of analog and digital semiconductor devices to address issues in different areas. Developments in semiconductor process technology nodes have progressively reduced component sizes and tightened spacing resulting in progressively increased transistor density. ICs progressively become smaller.

Flip-flops (latches) are used as data storage elements. In some circumstances, a flip-flop stores a single bit (binary digit) of data. In some circumstances, a flip-flop (latch) stores a state and represents a basic storage element of sequential logic in electronics, e.g., shift registers.

One type of flip-flop is a delay (D) flip-flop (FF). A D FF is a digital electronic circuit that delays the change of state of its output signal (Q) until the next active edge of a clock timing input signal occurs. The D FF is a modified Set-Reset flip-flop with the addition of an inverter to prevent the S and R inputs from being at the same logic level.

BRIEF DESCRIPTION OF THE DRAWINGS

One or more embodiments are illustrated by way of example, and not by limitation, in the figures of the accompanying drawings. The drawings are not to scale, unless otherwise disclosed.

FIGS. 1C, 1D and 1E are layout diagrams of a semiconductor device, in accordance with some embodiments.

FIGS. 5A-5B are flow diagrams of corresponding methods of manufacturing a semiconductor device, in accordance with some embodiments.

DETAILED DESCRIPTION

Figure 1A:
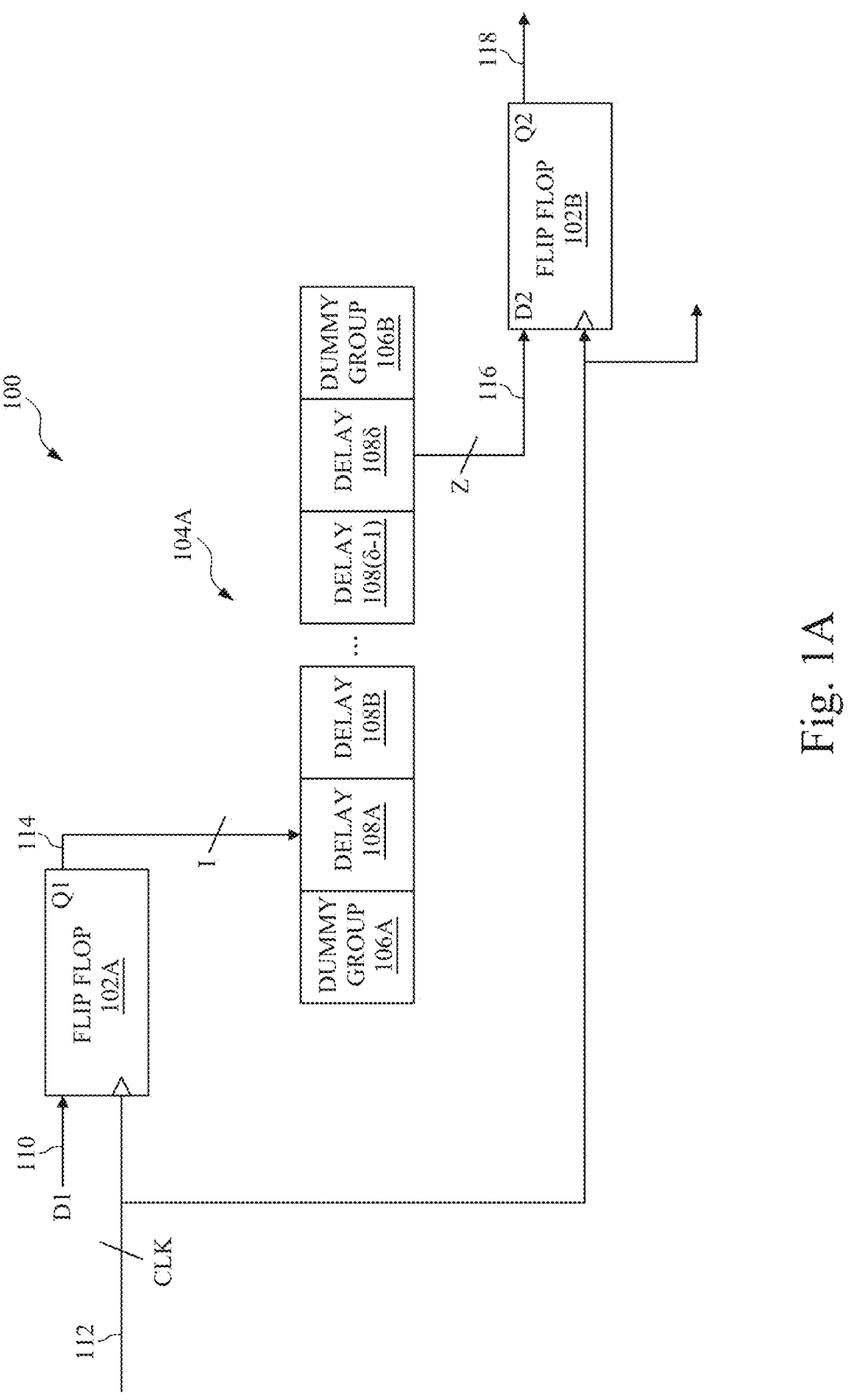
FIG. 1A is a block diagram of an integrated circuit (IC), in accordance with some embodiments.

The following discloses many different embodiments, or examples, for implementing different features of the subject matter. Examples of components, materials, values, steps, operations, arrangements, or the like, are described below to simplify the present disclosure. These are, of course, examples and are not intended to be limiting. Other components, values, operations, materials, arrangements, or the like, are contemplated. For example, the formation of a first feature over or on a second feature in the description that follows include embodiments in which the first and second features are formed in direct contact, and further include embodiments in which additional features are formed between the first and second features, such that the first and second features are in indirect contact. In addition, the present disclosure repeats reference numerals and/or letters in the various examples. This repetition is for purposes of simplicity of illustration in the figures and reduced repetition of corresponding discussion in the specification; the scope of any relationship imputable from elements-in-common between the various embodiments and/or configurations discussed are informed by looking at contextual differences between common elements and distinct elements in different embodiments. For example, these contextual differences include differences resulting from the function of the distinct elements, differences of interconnection among otherwise-common elements, differences of timing relationships for otherwise-common elements, the resulting changes in interconnections and timing relationships in the otherwise-common elements because of the operation of the distinct elements, and/or the like.

Further, spatially relative terms, such as "beneath," "below," "lower," "above," "upper" or the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly. In some embodiments, the term standard cell structure refers to a standardized building block included in a library of various standard cell structures. In some embodiments, various standard cell structures are selected from a library thereof and are used as components in a layout diagram representing a circuit.

In some embodiments, a semiconductor device, e.g., for use as a delay arrangement between otherwise serially connected first and second flip flops, includes: a first dummy group having a first set of dummy transistors; a first delay cell having a first set of active transistors; a second delay cell having a second set of active transistors; and a second dummy group having a second set of dummy transistors. In such embodiments, relative to a first direction (e.g., the X-axis), the first and second dummy groups and the first and second delay cells are arranged in a first row, the first row having a sequence arranged as the first dummy group, the first delay cell, the second delay cell, and the second dummy group, and wherein the first and second delay cells are free from having another dummy group therebetween.

According to another approach that has a delay arrangement between first and second flip flops, design rules of the other approach require any given delay cell to have a dummy group (DG) on each side of the given delay cell (DC) to protect the given DC from layout-dependent effects (LDEs). According to the other approach's delay arrangement, the total number of dummy groups ($\Sigma(DG)$) is one more than the total number of delay cells (($\Sigma(DC)$)) such that $\Sigma(DG)=\Sigma(DC)+1$; in other words, $\Sigma(DC)<\Sigma(DG)$. Insights by one or more inventors of the present application include the following: relative to the X-axis, though a delay cell suffers LDEs when the first delay cell abuts one or more types of a functional cell which is different than a delay cell (LDE-inducing cell), nevertheless, when the first delay cell abuts a second delay cell, the second delay cell does not induce LDEs in the first delay cell nor does the first delay cell induce LDEs in the second delay cell; for a delay arrangement according to the other approach that has first and second delay cells with no other delay cells therebetween, the other approach sandwiches the first delay cell between corresponding first and second dummy groups and sandwiches the second delay cell between corresponding third and fourth dummy groups such that the first and second delay cells are separated by the second and third dummy groups; the LDE-protection provided by the second and third dummy groups according to the other approach is unnecessary; because the LDE-protection provided by the other approach's second and third dummy groups is unnecessary, the increase (relative to the X-axis) in the size of the footprint (area) of the delay arrangement contributed by the second and third dummy groups according to the other approach is unnecessary; the other approach is overly LDE-protective with respect to delay arrangements that include first and second delay cells which have no LDE-inducing cells therebetween; and, regarding delay arrangements that include first and second delay cells which have no LDE-inducing cells therebetween; there is an opportunity to modify the design rule according to the other approach in a manner that yields delay arrangements with a smaller footprint as compared to the other approach but which achieve substantially the same level of protection from LDEs as delay arrangements according to the other approach. Accordingly, at least some delay arrangement embodiments of the present application include a row (relative to the X-axis) which has a sequence arranged as a first/left-most exterior dummy group, a first delay cell, a second delay cell and the second/right-most exterior dummy group such that the first and second delay cells are free from having another dummy group therebetween, and such that 2 (DG)<Σ(DC), which exhibits a smaller footprint (area) along the X-axis as compared to the other approach but which achieves substantially the same level of protection from LDEs as a delay arrangement according to the other approach.

In some embodiments, the semiconductor device further includes an additional batch of N delay cells that correspondingly include N sets of active transistors, where N is a positive integer; and relative to the first direction, the first and second dummy groups, the first and second delay cells and the additional batch N delay cells are arranged in a second row, the second row having a sequence arranged as the first dummy group, the first delay cell, the batch of N delay cells, the second delay cell, and the second dummy group. In such embodiments, relative to the X-axis, any two of the first and second delay cells and ones of the batch of N delay cells are free from having another dummy group being therebetween.

In some embodiments, each of the batch of N delay cells includes a first float-resistant inverter configured to receive an input signal at a first node and output a first inverted signal at a second node, the first node representing an input node of the first float-resistant inverter; and a second float-resistant inverter configured to receive the first inverted signal at the second node and output a second inverted signal at a third node. In some embodiments, the first delay cell includes a basic inverter configured to receive an input signal at a first node and output a first inverted signal at a second node, the first node representing an input node of the basic inverter; and a float-resistant inverter configured to receive the first inverted signal at the second node and output a second inverted signal at a third node. In some embodiments, the second delay cell includes a float-resistant inverter configured to receive an input signal at a first node and output a first inverted signal at a second node; and a basic inverter configured to receive the first inverted signal and output a second inverted signal at a third node, where the second inverted signal is a delayed output.

Relevant terminology includes the following. When data input to a sequential logic circuit, e.g., a flip flop, changes state, propagation delay refers to a finite amount of time needed by the logic gates to perform the operations on changed input data. A condition of valid operation is that the interval between clock pulses is long enough so that all the logic gates have time to respond to the changes in the input data and have their corresponding outputs settle to stable logic values before the next clock pulse occurs. In general, when the condition is met, the circuit is stable and reliable.

Hold time is the shortest time that a signal must be stable after the active edge of the clock, e.g., after the rising edge. When the hold time is not met, there is a risk that an incorrect interpretation of the logical state of the signal will be entered into a register, i.e., latched. Hold-slack is the difference in time between when the signal becomes valid and the hold time. In other words, when hold-slack is positive, then the signal remains valid longer than required by the hold time. A hold-slack violation is a type of slack violation in which the hold-slack is negative such that the signal remains valid too briefly, i.e., the signal remains valid for a shorter amount of time than is required by the hold time. In general, though a large positive hold-slack avoids signal-state misinterpretation, nevertheless a large positive hold-slack is undesirable because a significant portion of the large positive hold-slack represents delay that could be avoided. Accordingly, in general, the hold-slack is targeted for a near zero, positive number.

Generally, flip-flop hold time is represented as: the sum of the flip-flop clock (clk) rise time plus a data path delay time (e.g., time for the signal to reach the next flip flop) minus the rise time of the output signal (Q). As discussed above, the hold-slack is targeted for a near zero, positive number or stated otherwise, the first flip-flop hold time is slightly greater than or equal to the hold time of the second flip flop (i.e., to ensure the incoming signal from the first flip-flop remains valid longer than required by the hold time of the second flip-flop).

In some embodiments, PVT refers to process conditions (e.g., during manufacturing), voltage conditions (e.g., higher voltages), and temperature conditions (higher temperatures), all of which decrease the hold time and eventually a hold time violation occurs. To avoid this hold time violation, a delay cell is inserted in the data path to adjust the data path time delay (e.g., lengthen the hold time of the second flip-flop).

FIG. 1A is a block diagram of an integrated circuit (IC) 100, in accordance with some embodiments.

IC 100 includes flip-flops 102A and 102B that are communicatively connected to semiconductor device 104A. Semiconductor device 104A includes delay cells 108A, 108B, . . . , 108 ($\delta$–1), 108B between dummy group 106A and dummy group 106B, where $\delta$ is an integer and 2$\leq$$\delta$. In some embodiments, each of dummy groups 106A and 106B includes dummy transistors. Potential leakage current and/or parasitic current aside, dummy transistors are not configured to conduct current, thus dummy transistors are non-operational transistors.

In general, a transistor includes first and second source/drain (S/D) regions on opposite sides of a channel and a gate structure over the channel. An active transistor typically includes a first electrical connection to the gate structure, a second electrical connection to the first S/D region and a third electrical connection to the second S/D region by which the active transistor is configured to behave as a switch which selectively conducts current; typically, the first, second and third electrical connections carry signals that are different from each other.

In some embodiments in which first and second active transistors are electrically connected in series with each other but not in series with other transistors, the first and second transistors also share an S/D region. In such embodiments, the first and second transistors will have electrical connections to the corresponding gate structures and to the corresponding shared S/D regions. However, in such embodiments, the shared S/D region may not have an electrical connection to a component that is not part of the first or second transistors. In such embodiments, nevertheless, the first and second active transistors are able to conduct current, i.e., the first and second transistors remain operative as transistors.

By contrast, a dummy transistor, e.g., the dummy transistors of dummy groups 106A and 106B, lacks an electrical connection to the gate structure and/or an electrical connection to the first S/D region and/or an electrical connection to the second S/D region, which results in the dummy transistor not being able to conduct current, i.e., which renders the dummy transistor non-operative as a transistor. In some embodiments, the gate structure and the first and second S/D regions of a dummy transistor are electrically connected to the same signal, e.g., VSS or VDD, or the like, which similarly results in the dummy transistor not being able to conduct current, i.e., which renders the dummy transistor non-operative as a transistor.

In operation, flip-flop 102A receives a bit (D1) at bit line 110. In response to a clock (clk) signal on clk line 112, flip-flop 102A outputs a signal (Q1) that represents the state of D1 at the active edge of the clk signal on output line 114. FIG. 1A assumes that the active edge of the clk signal is the rising edge. In some embodiments, the active edge of the clk signal is the falling edge. The output Q1 on output line 114 is received by semiconductor device 104A, and more particularly at delay cell 108A, as input signal (I). Input signal I is routed through each of delay cells 108A, 108B, . . . , 108 (δ−1), 1088, a delayed version of input signal I being output by delay cell 1088 as output signal Z on line 116.

In some embodiments, the number 8 of delay cells is based on an amount of delay needed to correct a hold-time violation, i.e., is based on a hold-time fix.

$$\delta(\# \text{ of delay cells}) = \frac{\text{hold time fix in seconds}}{\text{time delay in seconds of one delay cell}}$$

Flip-flop 102B receives output Z on line 116 and upon receiving clk signal on clk line 112 will output a signal (Q2) on output line 118.

Figure 1B:
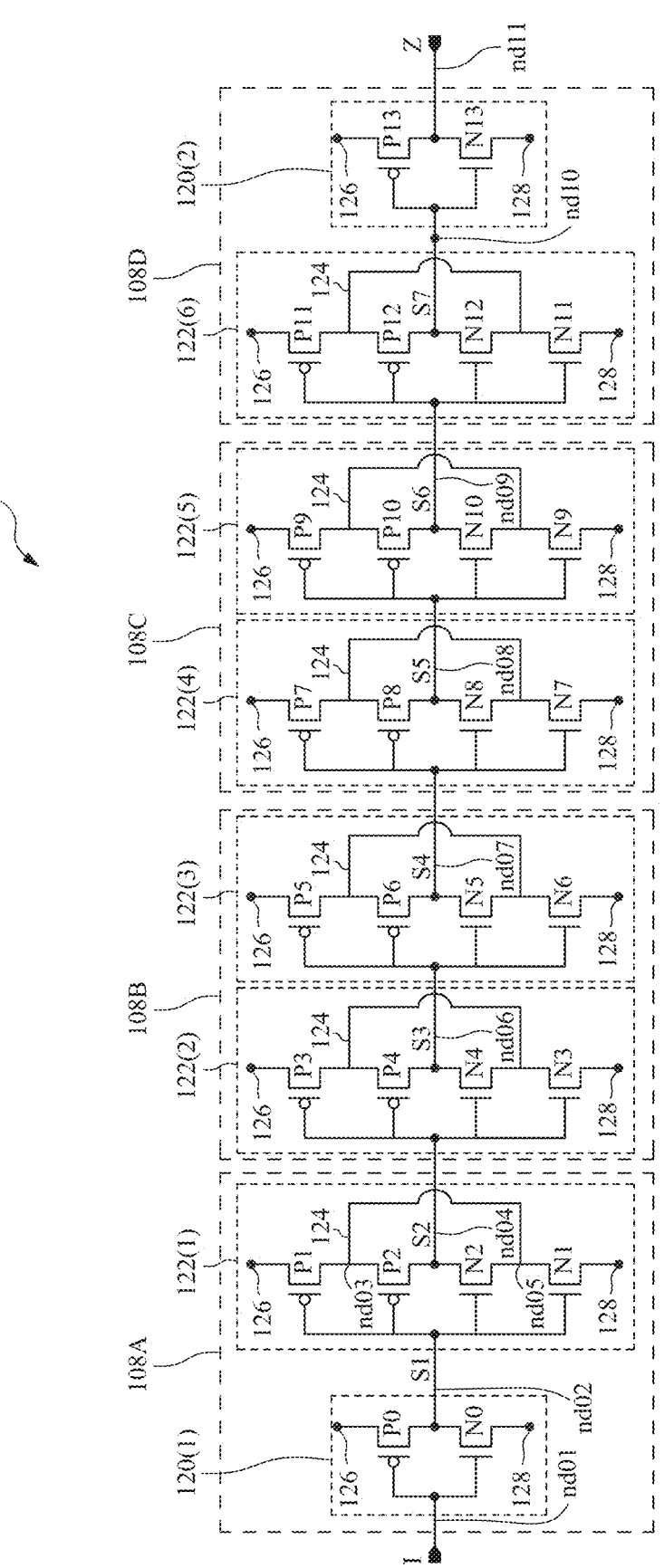
FIG. 1B is a schematic diagram of a semiconductor device, in accordance with some embodiments.

FIG. 1B is a schematic diagram of a semiconductor device 104B, in accordance with some embodiments.

Semiconductor device 104B is an example of semiconductor device 104A in which δ=4. Accordingly, semiconductor device 104B includes delay cells 108A, 108B, 108C, and 108D, each of which is a 1-bit delay cell. Delay cells 108A-108D are series-connected, i.e., are daisy-chained. Delay cell 108A includes a basic inverter 120(1) and a float-resistant inverter 122(1). As used herein, a float-resistant inverter includes float-resisting intra-connection (discussed below) that is not included in a basic inverter; accordingly, a basic inverter is an inverter that lacks the float-resisting intra-connection of a float-resistant inverter. Delay cell 108D includes float-resistant inverter 122(6) and basic inverter 120(2). Delay cell 108B includes float-resistant inverters 122(2) and 122(3). Delay cell 108C includes float-resistant inverters 122(4) and 122(5). Semiconductor device 104B includes field-effect transistors (FETs), namely positive-channel metal oxide semiconductor (PMOS) FETs (PFETs), P0, P1, P2, P3, P4, P5, P6, P7, P8, P9, P10, P11, P12, and P13, and negative-channel metal oxide semiconductors (NMOS) FETs (NFETs) N0, N1, N2, N3, N4, N5, N6, N7, N8, N9, N10, N11, N12, and N13.

In delay cell 108A, basic inverter 120(1) includes transistors P0 and N0, and float-resistant inverter 122(1) includes transistors P1-P2 and N1-N2. In basic inverter 120(1), transistors P0 and N0 are electrically connected in series between a node 126 having a first reference voltage, e.g., VDD, and a node 128 having a second reference voltage, e.g., VSS. More particularly, transistor P0 is electrically connected between node 126 and a node nd02. Transistor N0 is electrically connected between node nd02 and node 128. Gates of transistors P0 and N0 are electrically connected together and to node nd01, where node nd01 receives input signal I. Node nd02 represents the output of basic inverter 120(1) and has the inverted version of input signal I, namely signal S1. VDD is a voltage greater than VSS. In some embodiments, VSS is ground, less than ground, a floating ground or at or near ground.

In float-resistant inverter 122(1) of delay cell 108A, transistors P1-P2 and N1-N2 are electrically connected between nodes 126 and 128. More particularly, transistor P1 is electrically connected between node 126 and a node nd03. Transistor P2 is electrically connected between node nd03 and a node nd04. Transistor N2 is electrically connected between node nd04 and a node nd05. Transistor N1 is electrically connected between node nd05 and node 128. Gates of transistors P1, P2, N1, and N2 are electrically connected together and to node nd02, where node nd02 has signal S1. Not only does node nd02 represent the output of basic inverter 120(1), but it also represents the input of float-resistant inverter 122(1). Node nd04 represents the output of float-resistant inverter 122(1), and thus the output of delay cell 108A. Node nd04 has a signal S2, where signal S2 is the inverted version of signal S1.

Anti-float line 124 is electrically connected between node nd03 and node nd05. More generally, regarding an anti-float inverter (e.g., 122(1)) having four transistors (e.g., P1-P2 and N1-N2), an anti-float line (e.g., 124) is an electrical connection linking a node (e.g., nd03) at which the two PFETs (e.g., transistors P1 and P2) are serially connected together (referred to herein as a PMOS node) with a node (e.g., nd04) at which the two NFETs (e.g., transistors N1 and N2) are serially connected together (referred to herein as an NMOS node). In an anti-float inverter (e.g., 122(1)) having four transistors, the PFETs are off when the NFETs are on, whereas the NFETs are off when the PFETs are on. Anti-float line 124 reduces the chances of a floating state on the PMOS node when the two PFETs are off, and similarly reduces the chance of a floating state on the NMOS node when the two NFETs are off.

In delay cell 108B, float-resistant inverter 122(2) includes transistors P3-P4 and N3-N4. In float-resistant inverter 122 (2) of delay cell 108B, transistors P3-P4 and N3-N4 are electrically connected between nodes 126 and 128. More particularly, transistor P3 is electrically connected between node 126 and the PMOS node. Transistor P4 is electrically connected between the PMOS node and a node nd06. Transistor N4 is electrically connected between node nd06 and the NMOS node. Transistor N3 is electrically connected between the NMOS node and node 128. Gates of transistors P3, P4, N3, and N4 are electrically connected and to node nd04, where node nd04 has signal S2. In float-resistant inverter 122(2), anti-float line 124 electrically connects the PMOS node and the NMOS node. Not only does node nd04 represent the output of float-resistant inverter 122(1), but it also represents the input of float-resistant inverter 122(2) and delay cell 108B. Node nd06 represents the output of float-resistant inverter 122(2). Node nd06 has a signal S3, where signal S3 is the inverted version of signal S2.

In delay cell 108B, float-resistant inverter 122(3) includes transistors P5-P6 and N5-N6. In float-resistant inverter 122 (3) of delay cell 108B, transistors P5-P6 and N5-N6 are electrically connected between nodes 126 and 128. More particularly, transistor P5 is electrically connected between node 126 and the PMOS node. Transistor P6 is electrically connected between the PMOS node and a node nd07. Transistor N6 is electrically connected between node nd07 and the NMOS node. Transistor N5 is electrically connected between the NMOS node and node 128. Gates of transistors P5, P6, N5, and N6 are electrically connected and to node nd06, where node nd06 has signal S3. In float-resistant inverter 122(3), anti-float line 124 electrically connects the PMOS node and the NMOS node. Not only does node nd06 represent the output of float-resistant inverter 122(2), but it also represents the input of float-resistant inverter 122(3). Node nd07 represents the output of float-resistant inverter 122(3), and thus the output of delay cell 108B. Node nd07 has a signal S4, where signal S4 is the inverted version of signal S3.

In delay cell 108C, float-resistant inverter 122(4) includes transistors P7-P8 and N7-N8. In float-resistant inverter 122 (4) of delay cell 108C, transistors P7-P8 and N7-N8 are electrically connected between nodes 126 and 128. More particularly, transistor P7 is electrically connected between node 126 and the PMOS node. Transistor P8 is electrically connected between the PMOS node and a node nd08. Transistor N8 is electrically connected between node nd08 and the NMOS node. Transistor N7 is electrically connected between the NMOS node and node 128. Gates of transistors P7, P8, N7, and N8 are electrically connected and to node nd07, where node nd07 has signal S4. In float-resistant inverter 122(4), anti-float line 124 electrically connects the PMOS node and the NMOS node. Not only does node nd07 represent the output of float-resistant inverter 122(3), but it also represents the input of float-resistant inverter 122(4) and delay cell 108C. Node nd08 represents the output of float-resistant inverter 122(4). Node nd08 has a signal S5, where signal S5 is the inverted version of signal S4.

In delay cell 108C, float-resistant inverter 122(5) includes transistors P9-P10 and N9-N10. In float-resistant inverter 122(5) of delay cell 108C, transistors P9-P10 and N9-N10 are electrically connected between nodes 126 and 128. More particularly, transistor P9 is electrically connected between node 126 and the PMOS node. Transistor P10 is electrically connected between the PMOS node and a node nd09. Transistor N10 is electrically connected between node nd09 and the NMOS node. Transistor N9 is electrically connected between the NMOS node and node 128. Gates of transistors P9, P10, N9, and N10 are electrically connected and to node nd08, where node nd08 has signal S5. In float-resistant inverter 122(5), anti-float line 124 electrically connects the PMOS node and the NMOS node. Not only does node nd08 represent the output of float-resistant inverter 122(4), but it also represents the input of float-resistant inverter 122(5). Node nd09 represents the output of float-resistant inverter 122(5), and thus the output of delay cell 108C. Node nd09 has a signal S6, where signal S6 is the inverted version of signal S5.

In delay cell 108D, float-resistant inverter 122(6) includes transistors P11-P12 and N11-N12. In float-resistant inverter 122(6) of delay cell 108D, transistors P11-P12 and N11-N12 are electrically connected between nodes 126 and 128. More particularly, transistor P11 is electrically connected between node 126 and the PMOS node. Transistor P12 is electrically connected between the PMOS node and a node nd10. Transistor N12 is electrically connected between node nd10 and the NMOS node. Transistor N11 is electrically connected between the NMOS node and node 128. Gates of transistors P11, P12, N11, and N12 are electrically connected and to node nd09, where node nd09 has signal S6. In float-resistant inverter 122(6), anti-float line 124 electrically connects the PMOS node and the NMOS node. Not only does node nd09 represent the output of float-resistant inverter 122(5), but it also represents the input of float-resistant inverter 122(6) and delay cell 108D. Node nd10 represents the output of float-resistant inverter 122(6). Node nd10 has a signal S7, where signal S7 is the inverted version of signal S6.

In delay cell 108D, basic inverter 120(2) includes transistors P13 and N13 electrically connected in series between node 126 and node 128. More particularly, transistor P13 is electrically connected between node 126 and a node nd11. Transistor N13 is electrically connected between node nd11 and node 128. Gates of transistors P13 and N13 are electrically connected and to node nd10, where node nd10 receives input signal S7. Not only does node nd10 represent the output of float-resistant inverter 122(6), but it also represents the input of basic inverter 120(2), and node nd10 has the inverted version of signal S6. Node nd11 represents the output signal Z of basic inverter 120(2) as well as the output of delay cell 108C. Node nd11 has the inverted version of signal S7.

Regarding FIG. 1B, in some embodiments, up to N additional delay cells 108 (where N is a positive integer) are located between, e.g., delay cell 108C and delay cell 108D. In some embodiments, delay cell 108B is the only delay cell between delay cells 108A and 108D. Regarding FIG. 1B, in some embodiments, delay cells 108B-108C are omitted such that delay cell 108A is adjacent to delay cell 108D.

FIG. 1C is a layout diagram of a semiconductor device 104C, in accordance with some embodiments.

In some embodiments, semiconductor device 104C is an example of semiconductor device 104A of IC 100 or semiconductor device 104B. Semiconductor device layout 104C includes dummy group 106A and 106B (see FIG. 1D) located on opposite sides of delay cell patterns 108A-1088.

In some embodiments, delay cell 108A represents delay cell 108A of FIG. 1B and delay cell pattern 1088 represents delay cell 108D of FIG. 1B. In some embodiments, delay cells 108B, . . . , 108(δ-1) are like delay cells 108B and 108C of FIG. 1B in that each delay cell pattern includes two float-resistant inverter patterns.

Power rail pattern 132A extends along the X-axis above an upper portion of dummy group patterns 106A and 106B and delay cell patterns 108A-1088. Power rail pattern 132B extends along the X-axis below a lower portion of dummy group patterns 106A and 106B and delay cell patterns 108A-1088.

Power rails 132A and 132B are in a first layer of metallization. In some embodiments, depending upon the numbering convention of the corresponding process node by which such a semiconductor device is fabricated, the first (1st) layer of metallization M_1st is either metallization layer zero, M0, or metallization layer one, M1, and correspondingly the first layer of interconnection V_1st is either VIA0 or VIA1. In some embodiments, M0 is the first layer of metallization above a transistor layer. In some embodiments, the transistor layer includes components of transistors, e.g., active regions including source/drain (S/D) regions and channel regions therein, metal-over-S/D (MD) contact structures, via-to-MD (VD) contact structures, via-to-gate (VG) contact structures and gate structures, or the like.

An upper portion of dummy group patterns 106A and 106B and delay cell patterns 108A-1088 are located above an N-well pattern 134. P-type active region patterns (see FIG. 1D) are in N-well pattern 134, the latter being in a P-type substrate pattern 133.

Figure 1D:
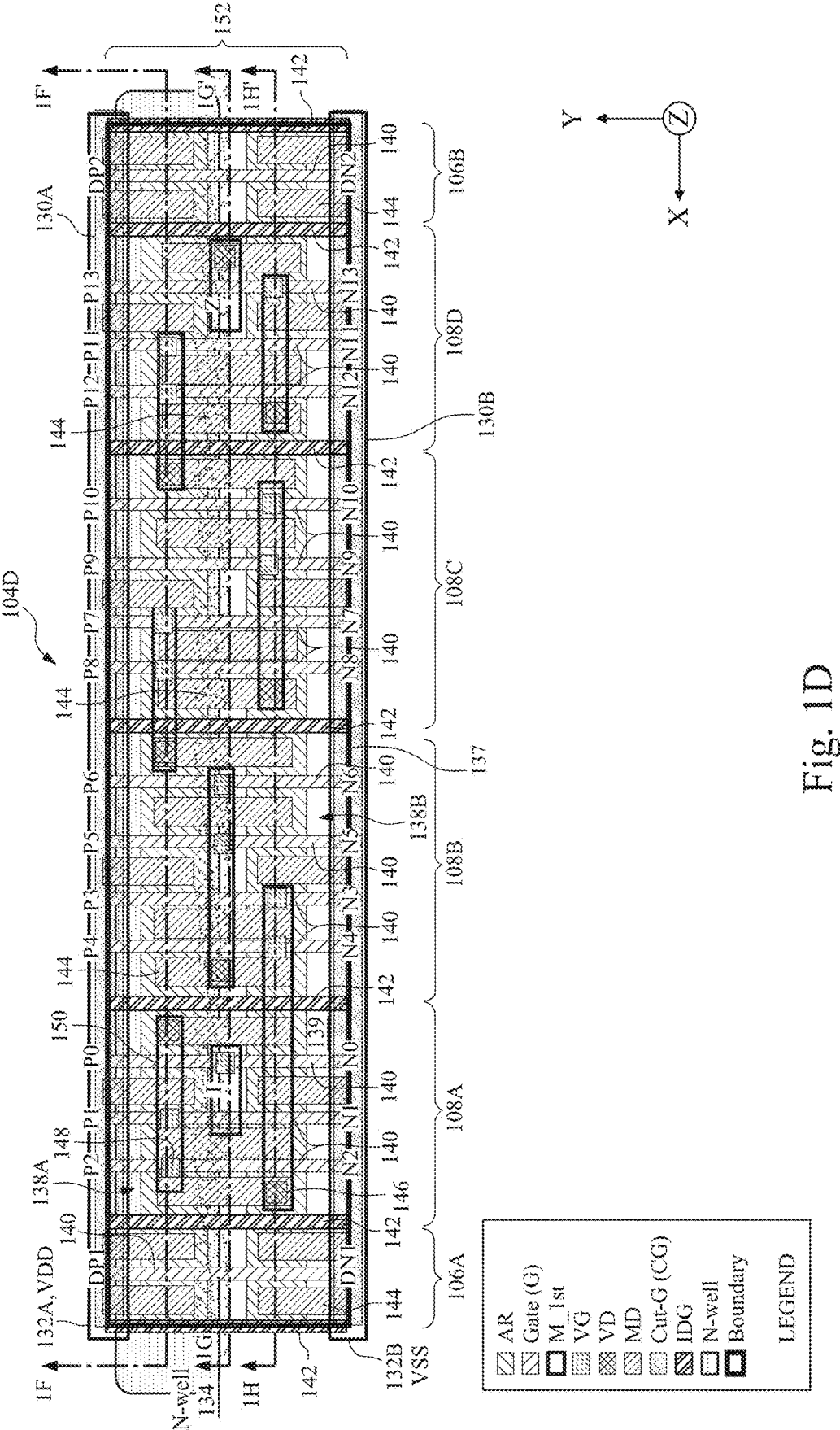

FIG. 1D is layout diagram of a semiconductor device 104D, in accordance with some embodiments.

In some embodiments, semiconductor device 104D of FIG. 1D is an example of semiconductor device 104A of IC 100, or semiconductor device 104B. In some embodiments, semiconductor device 104D is an example of semiconductor device 104C where δ=4.

In general, a layout diagram represents a semiconductor device. Shapes in the layout diagram represent corresponding components in the semiconductor device. The layout diagram per se is a top view. Shapes in the layout diagram are two-dimensional relative to, e.g., the X-axis and the Y-axis, whereas the semiconductor device being represented is three-dimensional. Typically, relative to the Z-axis, the semiconductor device is organized as a stack of layers in which are located corresponding structures, i.e., to which belong corresponding structures. Accordingly, each shape in the layout diagram represents, more particularly, a component in a corresponding layer of the corresponding semiconductor device. Typically, the layout diagram represents relative depth, i.e., positions along the Z-axis, of shapes and thus layers by superimposing a second shape on a first shape so that the second shape at least partially overlaps the first shape. For simplicity of discussion, i.e., as a discussion-expedient, some elements in the layout diagram of FIG. 1D are referred to as if they are counterpart structures in a corresponding semiconductor device rather than patterns/shapes per se.

Layout diagrams vary in terms of the amount of detail represented. In some circumstances, selected layers of a layout diagram are combined/abstracted into a single layer, e.g., for purposes of simplification. Alternatively, and/or additionally, in some circumstances, not all layers of the corresponding semiconductor device are represented, i.e., selected layers of the layout diagram are omitted, e.g., for simplicity of illustration. FIG. 1D is an example of a layout diagram in which selected layers have been omitted, e.g., interconnection and metallization layers over the M_1st layer.

In FIG. 1D, semiconductor device 104D includes a substrate region 139 which includes active region (AR) 138A which is configured for PMOS technology and AR 138B which is configured for NMOS technology. Substrate region 139 includes N-well region 134. AR 138A is in N-well 134. Each of N-well region 134 and ARs 138A and 138B has a long axis that extends in the X-axis. Each of N-well region 134 and ARs 138A and 138B has a short axis that extends in the Y-axis, the latter being perpendicular to the X-axis. ARs 138A and 138B include doped first areas that represent source/drain (S/D) regions (not shown) of the ARs. The S/D regions represent first transistor-components. Second areas of ARs 138A and 138B which are between corresponding S/D regions are channel regions (not shown) that represent second transistor-components. A boundary 137 encloses ARs 138A and 138B and is rectangular; hence, semiconductor device 104D is rectangular.

In FIG. 1D, relative to the Y-axis, a distance or size is alternately referred to as a height. Each of ARs 138A and 138B has a height. The height is determined by design rules of the corresponding semiconductor process technology node. Relative to the Y-axis, ARs 138A and 138B are spaced apart with corresponding gaps.

Metal-to-S/D (MD) contact structures 144 are over corresponding ones of the S/D regions. MD contact structures 144 represent third transistor-components. Gate lines 140 are over corresponding ones of the channel regions. Gate lines 140 represent fourth transistor-components. Long axes of gates 140 extend parallel in the Y-axis. In some embodiments, a given S/D region is formed by doping a portion of an AR that is between corresponding instances of gates 140 or that is adjacent to a corresponding instance of isolation dummy gates (IDGs) 142 with an appropriate conductivity-type dopant.

Via-to-S/D (VD) contact structures 146 represent connections between MD contact structures 144 and M_1st contact structures 150. Via-to-gate (VG) contact structures 148 represent connections between gate lines 140 and M_1st contact structures 150. VD contact structures 146 and VG contact structures 148 represent first and second types of fifth transistor-components.

In FIG. 1D, some instances of gates 140 have been replaced by IDG 142. An isolation dummy gate, such as created from isolation dummy gate patterns 142, is a dielectric structure that includes one or more dielectric materials and functions as an electrical isolation structure. Accordingly, an isolation dummy gate is not a structure that is electrically conductive and so does not function, e.g., as a gate electrode of an active transistor. In some embodiments, an isolation dummy gate is referred to as a dielectric gate structure. In some embodiments, an isolation dummy gate is an example of a structure included in CPODE layout scheme. In some embodiments, CPODE is an acronym for continuous poly on diffusion edge. In some embodiments, CPODE is an acronym for continuous poly on oxide diffusion edge. In some embodiments, an isolation dummy gate is based on a gate structure as a precursor. In some embodiments, an isolation dummy gate is formed by first forming a gate structure, e.g., a dummy gate structure, sacrificing/removing (e.g., etching) the gate structure to form a trench, (optionally) removing a portion of a substrate that previously had been under the gate structure to deepen the trench, and then filling the trench with one or more dielectric materials such that the physical dimensions of the resultant electrical isolation structure, i.e., the isolation dummy gate, are similar to the dimensions of the precursor which was sacrificed, namely the gate structure or the combination of the gate structure and the portion of the substrate.

IDG 142 separates dummy group 106A including dummy PMOS transistor DP1 and dummy NMOS transistor DN1, from delay cell 108A including active transistors P0, P1, P2, N0, N1, and N2. IDG 142 separates delay cell 108B including active transistors P3, P4, P5, P6, N3, N4, N5, and N6 from delay cell 108C including active transistors P7, P8, P9, P10, N7, N8, N9 and N10. IDG 142 separates dummy group 106B including dummy PMOS transistor DP2 and dummy NMOS transistor DN2, from delay cell 108D including active transistors P11, P12, P13, N11, N12, and N13. IDG 142 further separates delay cell 108C from delay cell 108D.

The layout diagram of FIG. 1D further includes cut-gate (CG) shapes/patterns. Cut gate (CG) patterns 130A and 130B are a cut gate electrode line pattern. The pattern is etched into a gate electrode layer, cutting the gate electrode lines. Cutting the gate electrode lines is performed during manufacturing. Long axes of cut gate patterns 130A and 130B extend substantially parallel to the X-axis. In general, where a given gate underlies a given CG shape such that a portion of the given gate is overlapped by the given CG shape, the given CG shape is used to indicate that the overlapped portion of the given gate will be removed during fabrication of a corresponding semiconductor device.

M_1st conductors 150 are over corresponding gate lines 140 and MD contact structures 144.

Active regions 138A and 138B, the S/D regions, MD contact structures 144 and gate lines 140 result in PMOS transistors P0, P1, P2, P3, P4, P5, P6, P7, P8, P9, P10, P11, P12, and P13 and NMOS transistors N0, N1, N2, N3, N4, N5, N6, N7, N8, N9, N10, N11, N12, and N13. Further, a set of the first to fifth transistor-components is arranged albeit not electrically connected as corresponding dummy transistors DP1 and DN1 that define dummy group 106A. Another set of the first to fifth transistor-components are electrically connected as corresponding active transistors P0, P1, P2, N0, N1, and N2 that define delay cell 108A. Another set of the first to fifth transistor-components is electrically connected as corresponding active transistors P11, P12, P13, N11, N12, and N13 that define delay cell 108D. Another set of the first to fifth transistor-components is arranged albeit not electrically connected as corresponding dummy transistors DP2 and DN2 that define dummy group 106B.

Another set of the first to fifth transistor-components is electrically connected as corresponding active transistors P3, P4, P5, P6, N3, N4, N5 and N6 that define delay cell 108B. Additional sets of the first to fifth transistor-components is electrically connected as corresponding active transistors P7, P8, P9, P10, N7, N8, N9 and N10 that define another delay cell, such as delay cell 108C.

In FIG. 1D, relative to the X-axis, semiconductor device has a row including dummy group 106A, delay cell 108A, delay cell 108B, delay cell 108C, delay cell 108D and dummy group 106B which are arranged in a sequence 106A:108A:108B:108C:108D:106B, where the notation 'x: y' denotes that x and y are neighbors. In terms of delay groups, any two of delay cells 108A-108D are free from other dummy groups being therebetween.

In terms of delay cells, the sequence of the row of FIG. 1D, which is arranged as 106A:108A:108B:108C:108D: 106B, is an open sequence as contrasted with a closed sequence. In general, and in terms of numerals, a first given sequence, e.g., 3:6:9, is regarded as being closed when no other numeral can be inserted between the first numeral, here 3, and the last numeral, here 6, nor can another numeral be inserted between numerals 6 and 9. Also, in general, and in terms of numerals, the first given sequence 369 is regarded as being open when additional numerals can be inserted between the first numeral, here 3, and the last numeral, here 9, e.g., between numerals 3 and 6 and/or between numerals 6 and 9. For example, a second given sequence is 32619. The second given sequence is a variation of (and more specifically, an expansion of) the first given sequence, wherein 2 has been inserted between 3 and 6, and 1 has been inserted between 6 and 9; stated differently, the second sequence corresponds to the first sequence being further arranged as 32619.

In some embodiments, an additional batch of N delay cells, where N is a positive integer, are located between delay cells 108A and 108D relative to the X-axis, wherein each delay cell of the batch of N delay cells is similar to delay cells 108B and 108C. The batch of N delay cells is in the first row. Relative to the X-axis, in such embodiments, the sequence is further arranged as first dummy group 106A, first delay cell 108A, the batch of N delay cells (batch_N), second delay cell 108D, and second dummy group 106B. Relative to the X-axis, and in terms of delay cells, any two of delay cells 108A-108D and the delay cells of the batch of N delay cells are free from other dummy groups being therebetween. The second row is a variation, i.e., an expansion of the first row. In terms of delay cells, the second row expands the first row in that batch_N is inserted between 108B and 108C as compared to the first row.

In some embodiments, the transistors of semiconductor device 104D are field-effect transistors (FETs). In some embodiments, AR 138A is doped with a first conductivity-type dopant, and AR 138B are doped with a second conductivity-type dopant. In some embodiments that are configured according to complementary metal oxide semiconductor (CMOS) technology, the following is true: AR 138A is doped with a first conductivity-type dopant, e.g., a P-type dopant, such that the transistors corresponding to AR 138A are PFETs; AR 138B is doped with a second conductivity-type dopant, e.g., an N-type dopant, such that the transistors corresponding to AR 138B are NFETs; and AR 138A is formed in corresponding N-well 134.

In FIG. 1D, the transistors of semiconductor device 104D are arranged to function as an active circuit. In FIG. 1D, the active circuit includes series-combination of delay cells, e.g., delay cells 108A-108D. In FIG. 1D, each delay cell is a series-combination of a basic inverter and a float-resistant inverter, e.g., as in delay cells 108A and 108D, or a series-combination of two float-resistant inverters, e.g., as in delay cells 108B and 108C. In FIG. 1D, the number of gates 140, and therefore the corresponding number of transistors, has been reduced for simplicity of illustration. As a practical matter, the active circuit defined by the transistors of semiconductor device 104D determines the number of transistors to be included in semiconductor device 104D, and thus the number of gates 140 to be included in semiconductor device 104D.

In some embodiments, semiconductor device 104D omits delay cells 108B and 108C; as a result, relative to the X-axis, second dummy groups 106A and 106B and delay cells 108A and 108D are arranged in a third row that includes dummy group 106A, delay cell 108A, delay cell 108D, and dummy group 106B which are arranged in a sequence 106A:108A: 108D:106B. In terms of delay cells, the sequence of the third row is an open sequence. Relative the X-axis, and in terms of dummy groups, delay cells 108A and 108D are free from having another dummy group therebetween.

Figure 1E:
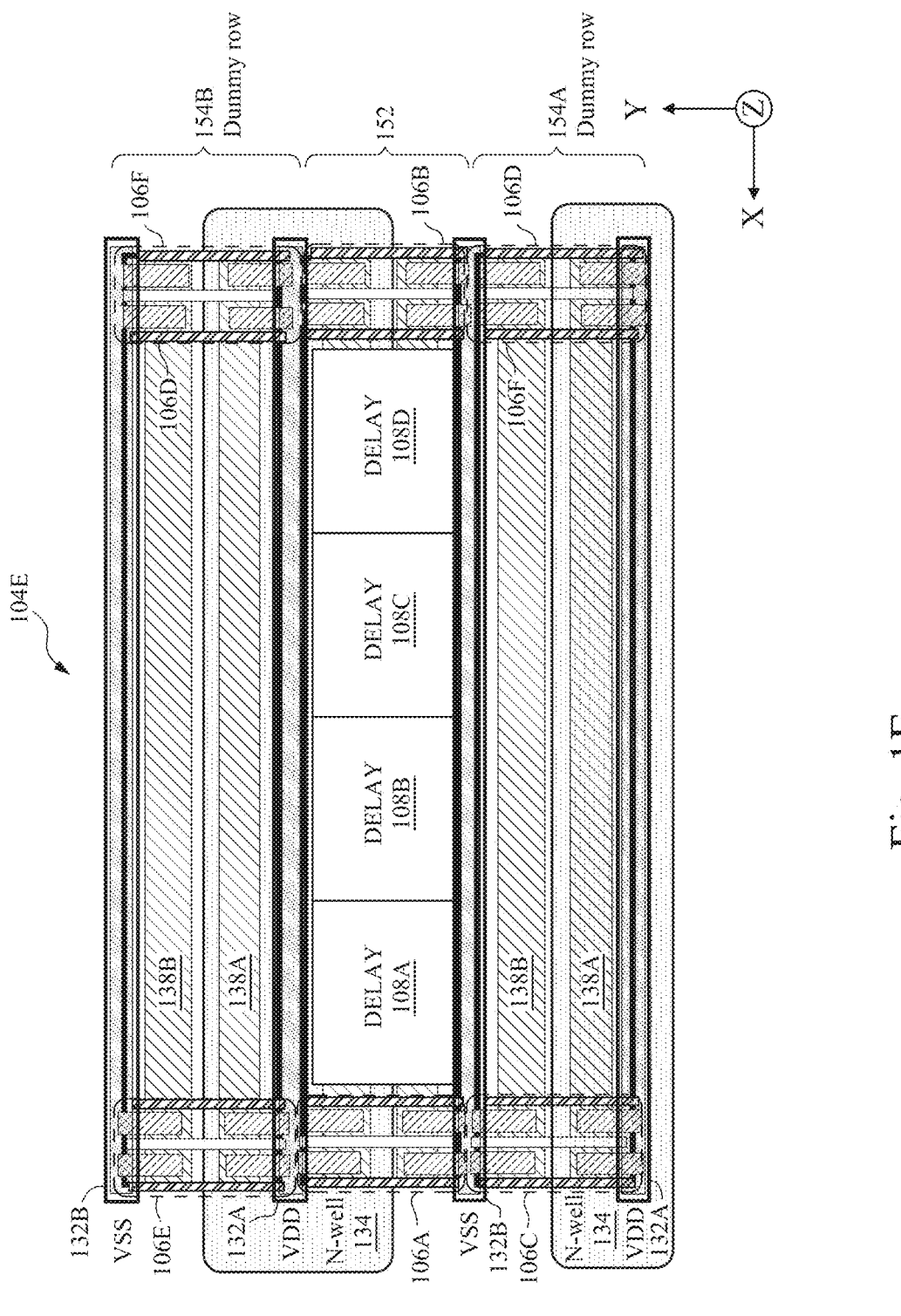

For purposes of later discussion, row 152 includes dummy group 106A, delay cell 108A, delay cell 108B, delay cell 108C, delay cell 108D, and dummy group 106B. Relative to the X-axis, row 152 has a sequence arranged as 106A:108A:108B:108C:108D:106B. In FIG. 1E, as row 152 includes four delay cells, δ=4. In some embodiments, more generally, row 152 includes dummy group 106A, delay cell 108A, . . . , delay cell 108 (δ-1), delay cell 108δ, and dummy group 106B, and has a sequence arranged as 106A: 108A: . . . :108δ:106B; in such embodiments of row 152, δ=2. In some embodiments, row 152 includes dummy group 106A, delay cell 108A, and dummy group 106B, and has a sequence 106A:108A:106B; in such embodiments, δ=1.

FIG. 1E is layout diagram of a semiconductor device 104E, in accordance with some embodiments.

In some embodiments, semiconductor device 104E is an example of semiconductor device 104A of IC 100 or semiconductor devices 104B, 104C (i.e., δ=4), 104D, or the like. In FIG. 1E, and for that matter FIGS. 2A-2G and 3A-3B, for simplicity of illustration and discussion, it is assumed that δ=4.

Semiconductor device 104E includes: PMOS ARs 138A and NMOS ARs 138B, which are interleaved relative to the Y-axis, and two instances of N-well 134. Each of rows 152, 154A and 154B includes a PMOS AR 138A and an NMOS AR 138B. More particularly regarding N-wells, semiconductor device 104E includes: an instance of N-well 134 in which are located a PMOS AR of delay row 152 and a PMOS AR of dummy row 154B; and an instance of N-well 134 in which is located a PMOS AR of dummy row 154A.

Relative to the Y-axis, row 152 is abutted at a lower edge by a dummy row 154A that includes dummy groups 106C and 106D. Relative to the X-axis, dummy row 154A includes no delay cell (or, for that matter, no other dummy group) between dummy groups 106C and 106D. Whereas dummy row 154A does not include a delay cell, row 152 does include one or more delay cells, i.e., delay cells 108A-108D, as part of a delay arrangement such that row 152 is referred to as a delay row in some embodiments. Relative to the Y-axis, an upper edge of delay row 152 is abutted by a dummy row 154B that includes dummy groups 106E and 106F. Relative to the X-axis, dummy row 154B includes no delay cell (or, for that matter, no other dummy group) between dummy groups 106E and 106F. Relative to the Y-axis, a dummy row, such as either dummy rows 154A or 154B, has a benefit of isolating an abutting row, such as delay row 152, from noise.

In FIG. 1E, relative to the X-axis: dummy groups 106C and 106E align with dummy group 106A; and dummy groups 106D and 106F align with dummy group 106B.

Figure 1F:
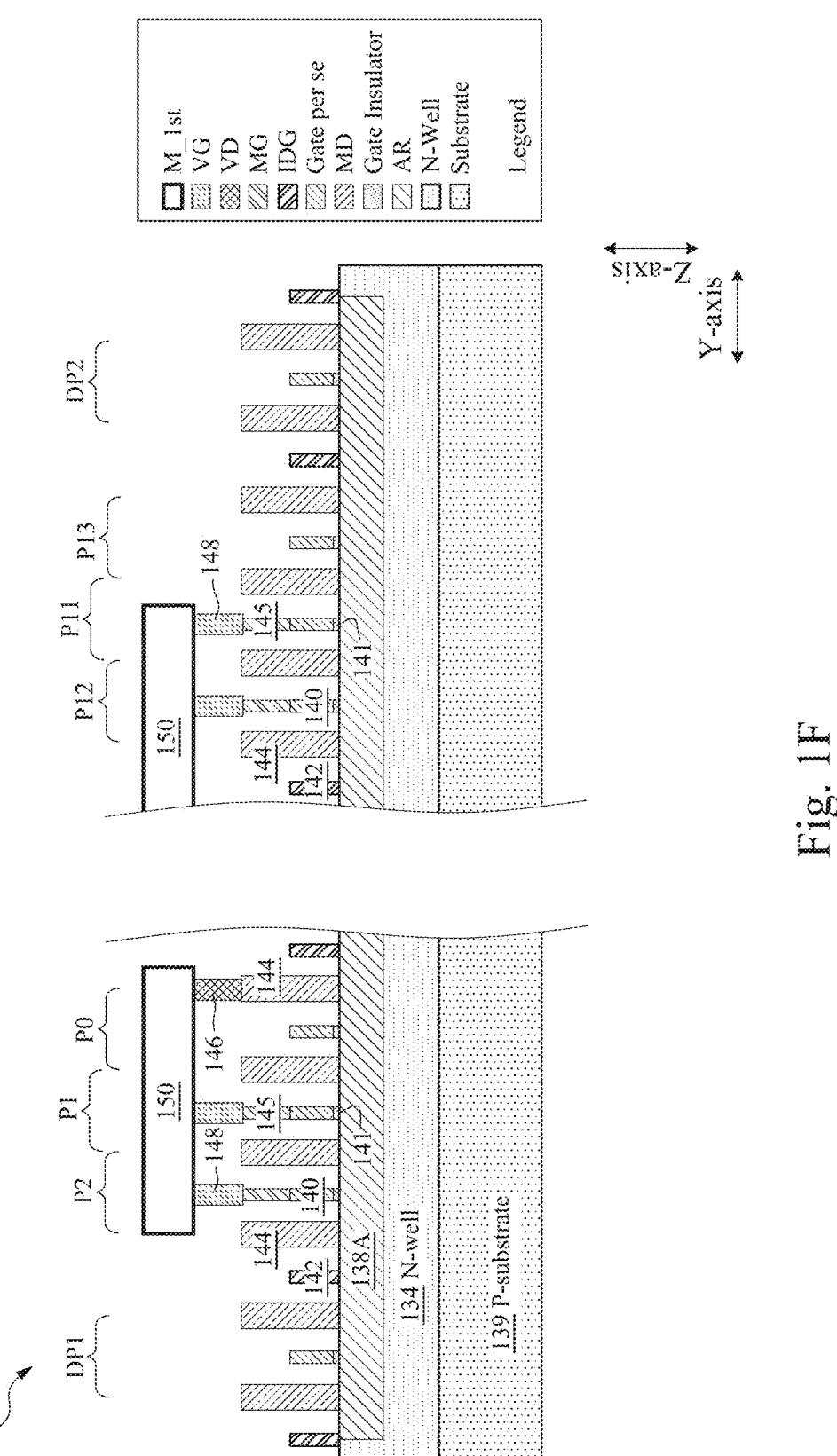
FIGS. 1F-1H are corresponding cross-sections of a semiconductor device, in accordance with some embodiments.
Figure 1G:
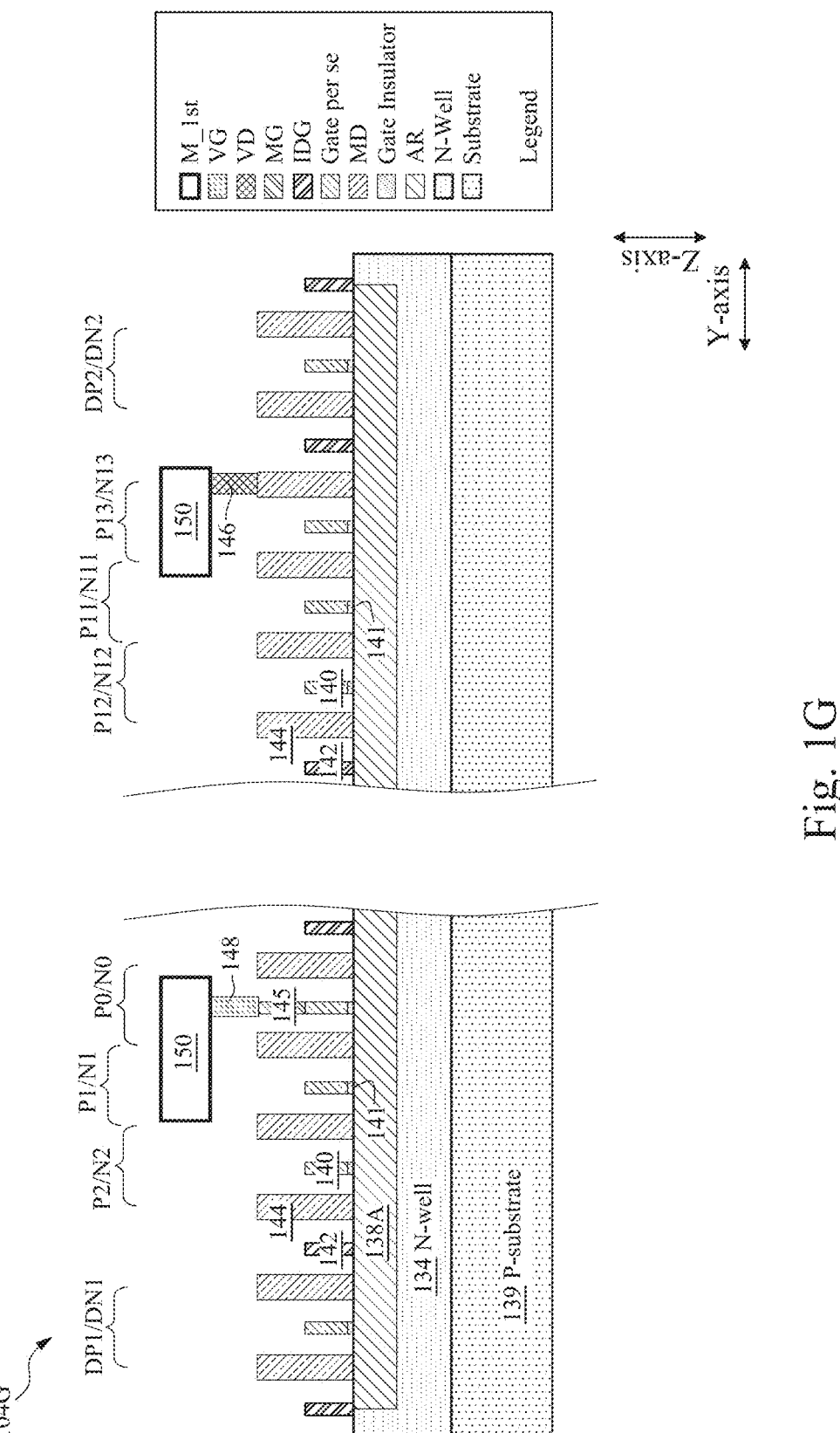
Figure 1H:
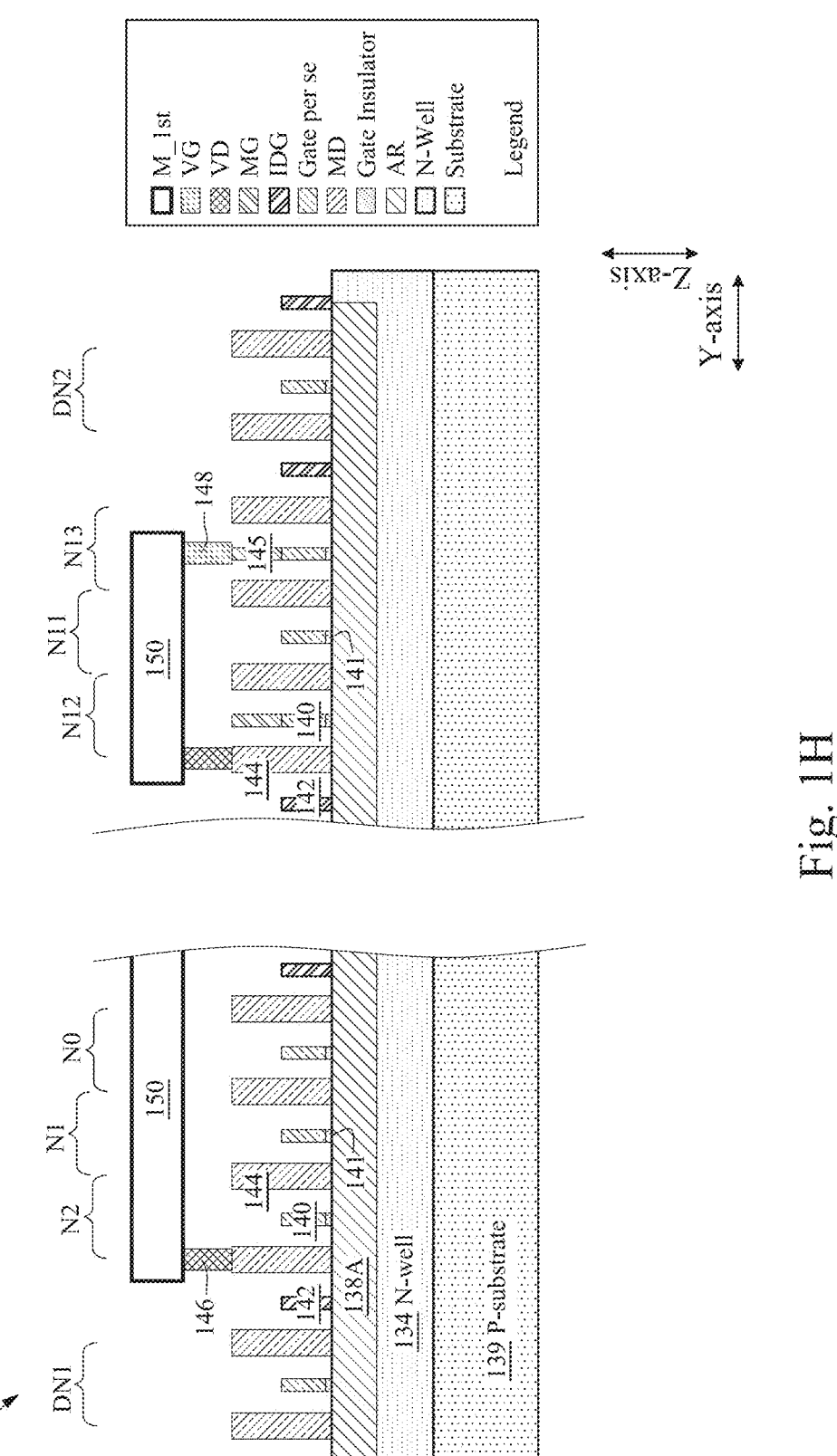

FIGS. 1F-1H corresponding cross-sections 104F-104H of semiconductor device 104D of FIG. 1D, in accordance with some embodiments.

Cross-section 104F of FIG. 1F corresponds to the section line 1F-1F' in FIG. 1D. Cross-section 104G of FIG. 1G corresponds to the section line 1G-1G' in FIG. 1D. Cross-section 104H of FIG. 1H corresponds to the section line 1H-1H' in FIG. 1D. In addition to the components shown in FIG. 1D, each of FIGS. 1F-1H further includes: gate insulator segments 141 between AR 138A and corresponding gate structures 140; and metal-to-gate (MG) contact structures 145 between gate structures 140 and corresponding VG structures 148. MG contact structures 145 represent a third type of fifth transistor-components.

In FIGS. 1F-1G, each of transistors P0-P2, P11-P13, N0-N2 and N11-N13 is configured as an active transistor. Accordingly, each of transistors P0-P2, P11-P13, N0-N2 and N11-N13 has electrical connections to the gate structure and/or the first and/or second S/D regions that are indicative of configuration as an active transistor, as discussed in more detail below. By contrast, each of DP1-DP2 and DN1-DN2 is a dummy transistor which lacks electrical connections to the gate structure, the first S/D region and the second S/D regions that otherwise would result in an active transistor configuration, as discussed in more detail below.

In more detail as to the active transistors, regarding FIG. 1F, the following it is to be recalled: transistors P2 and N2 share a corresponding gate structure 140; transistors P1 and N1 share a corresponding gate structure 140; transistors P12 and N12 share a corresponding gate structure 140; and transistors P11 and N11 share a corresponding gate structure 140.

In FIG. 1F, transistors P2 and N2 (FIG. 1H) have MG contact structure 145 and VG contact structure 148 between gate structure 140 (the former being shared) and a corresponding M_1st segment 150, which represents an electrical connection to shared gate structure 140 that, in part, configures each of transistors P2 and N2 as an active transistor.

Transistors P1 and N1 (FIG. 1H) have MG contact structure 145 and VG contact structure 148 between gate structure 140 (the former being shared) and a corresponding M_1st segment 150, which represents an electrical connection to shared gate structure 140 that, in part, configures each of transistors P1 and N1 as an active transistor. Transistors P0 and N0 (FIG. 1H) have MD contact structure 144 and VD contact structure 146 between the corresponding S/D region and a corresponding M_1st segment structure 150, which represents an electrical connection to the corresponding S/D regions that, in part, configures each of transistors P0 and N0 as an active transistor.

In FIG. 1F, transistors P12 and N12 (FIG. 1H) have MG contact structure 145 and VG contact structure 148 between gate structure 140 (the former being shared) and a corresponding M_1st segment 150, which represents an electrical connection to shared gate structure 140 that, in part, configures each of transistors P12 and N12 as an active transistor. Transistors P11 and N11 (FIG. 1H) have MG contact structure 145 and VG contact structure 148 between gate structure 140 (the former being shared) and a corresponding M_1st segment 150, which represents an electrical connection to shared gate structure 140 that, in part, configures each of transistors P11 and N11 as an active transistor.

In more detail as to the active transistors, regarding FIG. 1G, the following is to be recalled: transistors P0 and N0 share a corresponding gate structure 140; and transistors P13 and N13 share a corresponding MD contact structure 144.

In FIG. 1G, transistors P0 and N0 have MG contact structure 145 and VG contact structure 148 between gate structure 140 (the former being shared) and a corresponding M_1st segment 150, which represents an electrical connection to shared gate structure 140 that, in part, configures each of transistors P0 and N0 as an active transistor. Transistors P13 and N13 have MD contact structure 144 (the former being shared) and VD contact structure 146 between the corresponding S/D regions and a corresponding M_1st segment structure 150, which represents an electrical connection to the corresponding S/D regions that, in part, configures each of transistors P13 and N13 as an active transistor.

In more detail as to the active transistors, regarding FIG. 1H, the following is to be recalled: transistors N2 and P2 share a corresponding MD contact structure 144; transistors N12 and P12 share a corresponding MD contact structure 144; and transistors N13 and P13 share a corresponding gate structure 140.

In FIG. 1H, transistors N2 and P2 (FIG. 1F) have MD contact structure 144 (the former being shared) and VD contact structure 146 between the corresponding S/D regions and a corresponding M_1st segment structure 150, which represents an electrical connection to the corresponding S/D regions that, in part, configures each of transistors N2 and P2 as an active transistor. Transistors N12 and P12 (FIG. 1F) have MD contact structure 144 (the former being shared) and VD contact structure 146 between the corresponding S/D regions and a corresponding M_1st segment structure 150, which represents an electrical connection to the corresponding S/D regions that, in part, configures each of transistors N12 and P12 as an active transistor. Transistors N13 and P13 (FIG. 1F) have MG contact structure 145 and VG contact structure 148 between shared gate structure 140 and a corresponding M_1st segment 150, which represents an electrical connection to gate structure 140 that, in part, configures each of transistors N13 and P13 as an active transistor.

In more detail as to the dummy transistors, regarding FIG. 1F, the following is to be recalled: dummy transistors DP1 and DN1 (FIG. 1G) do not share a corresponding MD structure 144; dummy transistors DP1 and DN1 (FIG. 1G) share a corresponding gate structure 140; dummy transistors DP2 and DN2 (FIG. 1G) do not share a corresponding MD structure 144; and dummy transistors DP2 and DN2 (FIG. 1G) share a corresponding gate structure 140.

In FIG. 1F, dummy transistor DP1 has no MD contact structure 144 nor VD contact structure 146 between the corresponding S/D regions and a corresponding M_1st segment structure 150 such that dummy transistor DP1 lacks an electrical connection to the corresponding S/D regions that, in part, could otherwise indicate dummy transistor DP1 as having an active transistor configuration. Dummy transistor DP1 has no MG contact structure 145 nor VG contact structure 148 between gate structure 140 (the former being shared) and a corresponding M_1st segment 150 such that dummy transistor DP1 lacks an electrical connection to shared gate structure 140 that, in part, could otherwise indicate dummy transistor DP1 as having an active transistor configuration.

In FIG. 1F, dummy transistor DP2 has no MD contact structure 144 nor VD contact structure 146 between the corresponding S/D regions and a corresponding M_1st segment structure 150 such that dummy transistor DP2 lacks an electrical connection to the corresponding S/D regions that, in part, could otherwise indicate dummy transistor DP2 as having an active transistor configuration.

Dummy transistor DP2 has no MG contact structure 145 nor VG contact structure 148 between gate structure 140 (the former being shared) and a corresponding M_1st segment 150 such that dummy transistor DP2 lacks an electrical connection to shared gate structure 140 that, in part, could otherwise indicate dummy transistor DP2 as having an active transistor configuration.

In more detail as to the dummy transistors, regarding FIG. 1G, the following is to be recalled: dummy transistors DP1 and DN1 share a corresponding gate structure 140; and dummy transistors DP2 and DN2 share a corresponding gate structure 140. In FIG. 1G, dummy transistor DP1 has no MG contact structure 145 nor VG contact structure 148 between gate structure 140 (the former being shared) and a corresponding M_1st segment 150 such that dummy transistor DP1 lacks an electrical connection to shared gate structure 140 that, in part, could otherwise indicate dummy transistor DP1 as having an active transistor configuration.

Dummy transistor DP2 has no MG contact structure 145 nor VG contact structure 148 between gate structure 140 (the former being shared) and a corresponding M_1st segment 150 such that dummy transistor DP2 lacks an electrical connection to shared gate structure 140 that, in part, could otherwise indicate dummy transistor DP2 as having an active transistor configuration.

In more detail as to the dummy transistors, regarding FIG. 1H, the following is to be recalled: dummy transistors DN1 and DP1 (FIG. 1F) do not share a corresponding MD structure 144; dummy transistors DN1 and DP1 (FIG. 1F) share a corresponding gate structure 140; dummy transistors DN2 and DP2 (FIG. 1F) do not share a corresponding MD structure 144; and dummy transistors DN2 and DP2 (FIG. 1F) share a corresponding gate structure 140.

In FIG. 1H, dummy transistor DN1 has no MD contact structure 144 nor VD contact structure 146 between the corresponding S/D regions and a corresponding M_1st segment structure 150 such that dummy transistor DN1 lacks an electrical connection to the corresponding S/D regions that, in part, could otherwise indicate dummy transistor DN1 as having an active transistor configuration. Dummy transistor DN1 has no MG contact structure 145 nor VG contact structure 148 between gate structure 140 (the former being shared) and a corresponding M_1st segment 150 such that dummy transistor DN1 lacks an electrical connection to shared gate structure 140 that, in part, could otherwise indicate dummy transistor DN1 as having an active transistor configuration.

Dummy transistor DN2 has no MD contact structure 144 nor VD contact structure 146 between the corresponding S/D regions and a corresponding M_1st segment structure 150 such that dummy transistor DN2 lacks an electrical connection to the corresponding S/D regions that, in part, could otherwise indicate dummy transistor DN2 as having an active transistor configuration.

In FIG. 1H, dummy transistor DN2 has no MG contact structure 145 nor VG contact structure 148 between gate structure 140 (the former being shared) and a corresponding M_1st segment 150 such that dummy transistor DN2 lacks an electrical connection to shared gate structure 140 that, in part, could otherwise indicate dummy transistor DN2 as having an active transistor configuration. At least for the reasons discussed above in the context of FIGS. 1F-1G, each of DP1-DP2 and DN1-DN2 lacks electrical connections that otherwise could be indicative of an active transistor configuration. Thus, each of DP1-DP2 and DN1-DN2 is not able to conduct current, i.e., is non-operative as a transistor. In contrast, each of transistors P0-P2, P11-P13, N0-N2 and N11-N13 has electrical connections that are indicative of configuration as an active transistor.

Figure 2A:
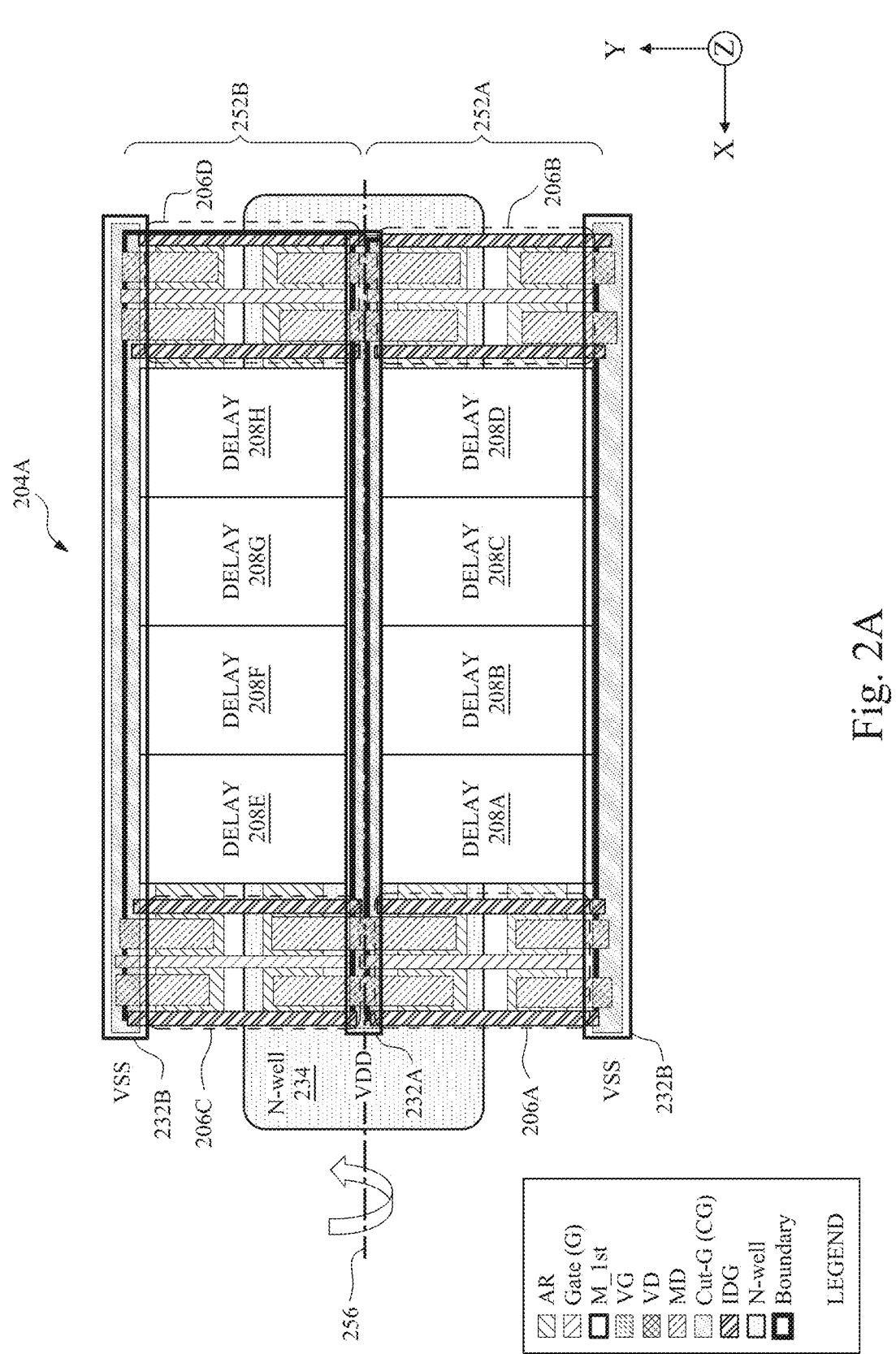
FIGS. 2A, 2B, 2C, 2D, 2E, 2F, and 2G are layout diagrams of a semiconductor device, in accordance with some embodiments.

FIG. 2A is layout diagram of a semiconductor device 204A, in accordance with some embodiments.

In some embodiments, semiconductor device 204A is an example of two semiconductor devices such as semiconductor device 104A of IC 100 or semiconductor devices 104B, 104C, 104D or 104E, where the two semiconductor devices which are stacked one upon the other relative to the Y-axis.

Semiconductor device 204A includes delay rows 252A and 252B. Relative the Y-axis, delay row 252B is stacked on delay row 252A. Delay row 252A is an example of delay row 152. Delay row 252A includes dummy group 206A, delay cell 208A, delay cell 208B, delay cell 208C, delay cell 208D, and dummy group 206B which are arranged in a sequence 206A:208A:208B:208C:208D:206B. Dummy group 206A is an example of dummy group 106A and dummy group 206B is an example of dummy group 106B. Delay cells 208A through 208D are corresponding examples of delay cells 108A through 108D. Dummy groups 206C and 206D are corresponding examples of dummy groups 106A and 106B. Therefore, discussion of the structure of dummy groups 206A through 206D and delay cells 208A through 208H is omitted for the sake of brevity. Relative to the Y-axis, a lower edge of delay row 252B abuts an upper edge of delay row 252A.

Delay rows 252A and 252B are similar. More particularly, delay row 252B corresponds to delay row 252A albeit mirrored about axis 256. Axis 256 extends in the direction of the X-axis. In some embodiments, relative to a context in which delay row 252A is revolved about axis 256, delay row 252B is mirror symmetric with respect to delay row 252A. In some embodiments, delay row 252B is identical to delay row 252A.

In semiconductor device 204A, axis 256 is substantially coaxial with a long axis of a power rail 232A. A long axis of N-well 234 is substantially coaxial with axis 256. A long axis of VSS power rail 232B is substantially coaxial with axis 256.

In FIG. 2A, delay row 252A is a 1-bit delay arrangement which includes 4 one-bit delay cells, namely delay cells 208A-208D. Delay row 252B is a 1-bit delay arrangement which includes 4 one-bit delay cells, namely delay cells 208E-208H. In some embodiments, semiconductor device 204A is configured to be used where a bit count is an integer multiple of 2 (e.g., 2 bits, 4 bits, or the like).

Figure 2B:
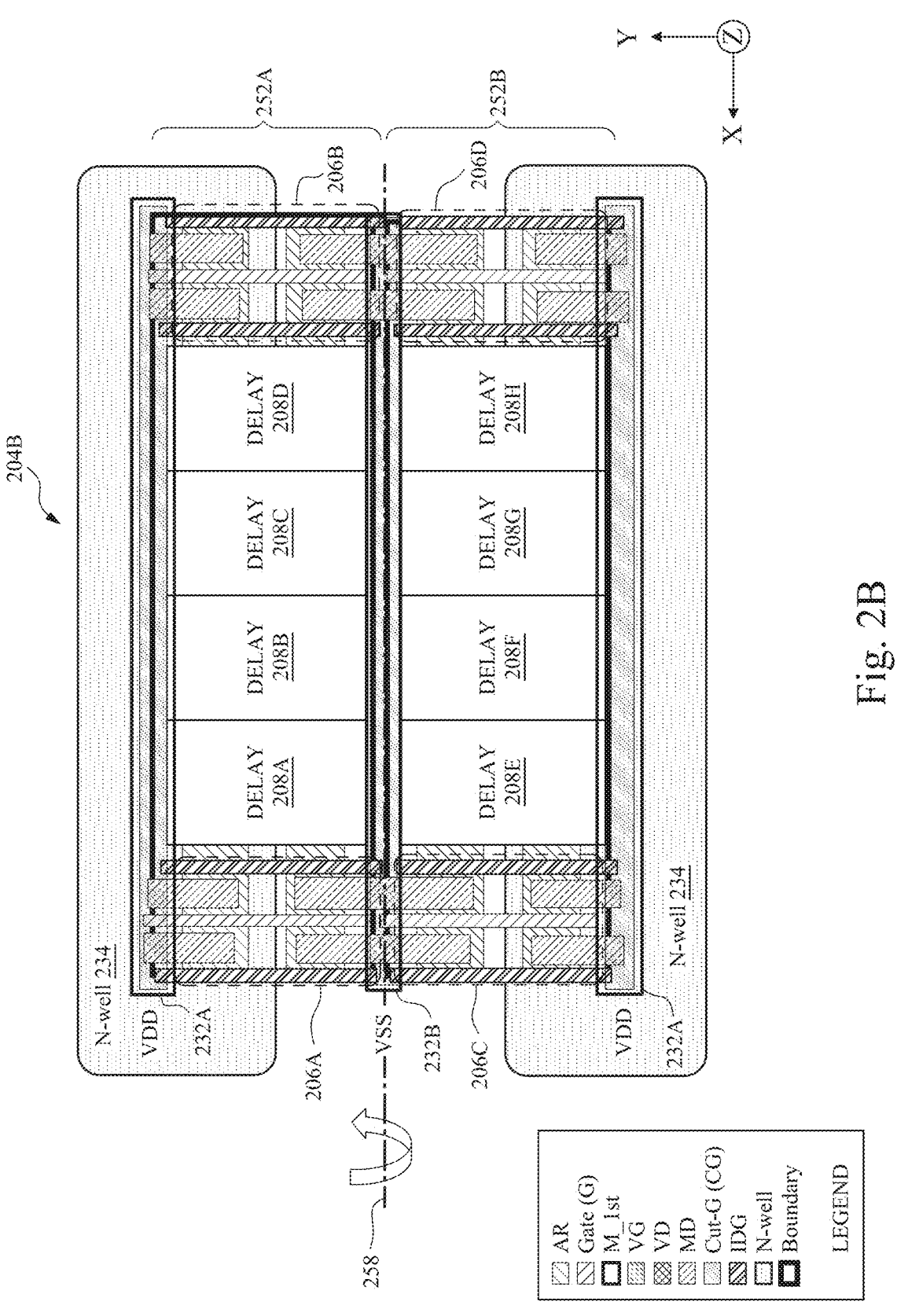

FIG. 2B is layout diagram of a semiconductor device 204B, in accordance with some embodiments.

Semiconductor device 204B of FIG. 2B is similar to semiconductor device 204A of FIG. 2A; for the sake of brevity, the discussion will focus on differences between FIG. 2B and FIG. 2A. FIG. 2B includes two instances of N-well 234 whereas FIG. 2A includes one instance of N-well 234. FIG. 2B has axis 258 rather than axis 256 of FIG. 2A. In FIG. 2B and relative the Y-axis, delay row 252A is stacked on delay row 252B whereas delay row 252B is stacked on delay row 252A in FIG. 2A.

Semiconductor device 204B includes delay rows 252A and 252B. In FIG. 2B, delay row 252B mirrors delay row 252A about axis 258. In some embodiments, relative to a context in which delay row 252A is revolved about axis 258, delay row 252B is mirror symmetric with respect to delay row 252A. In some embodiments, delay row 252B is identical to delay row 252A. Axis 258 extends in the direction of the X-axis and is substantially coaxial with a long axis of a VSS power rail 232B.

Figure 2C:
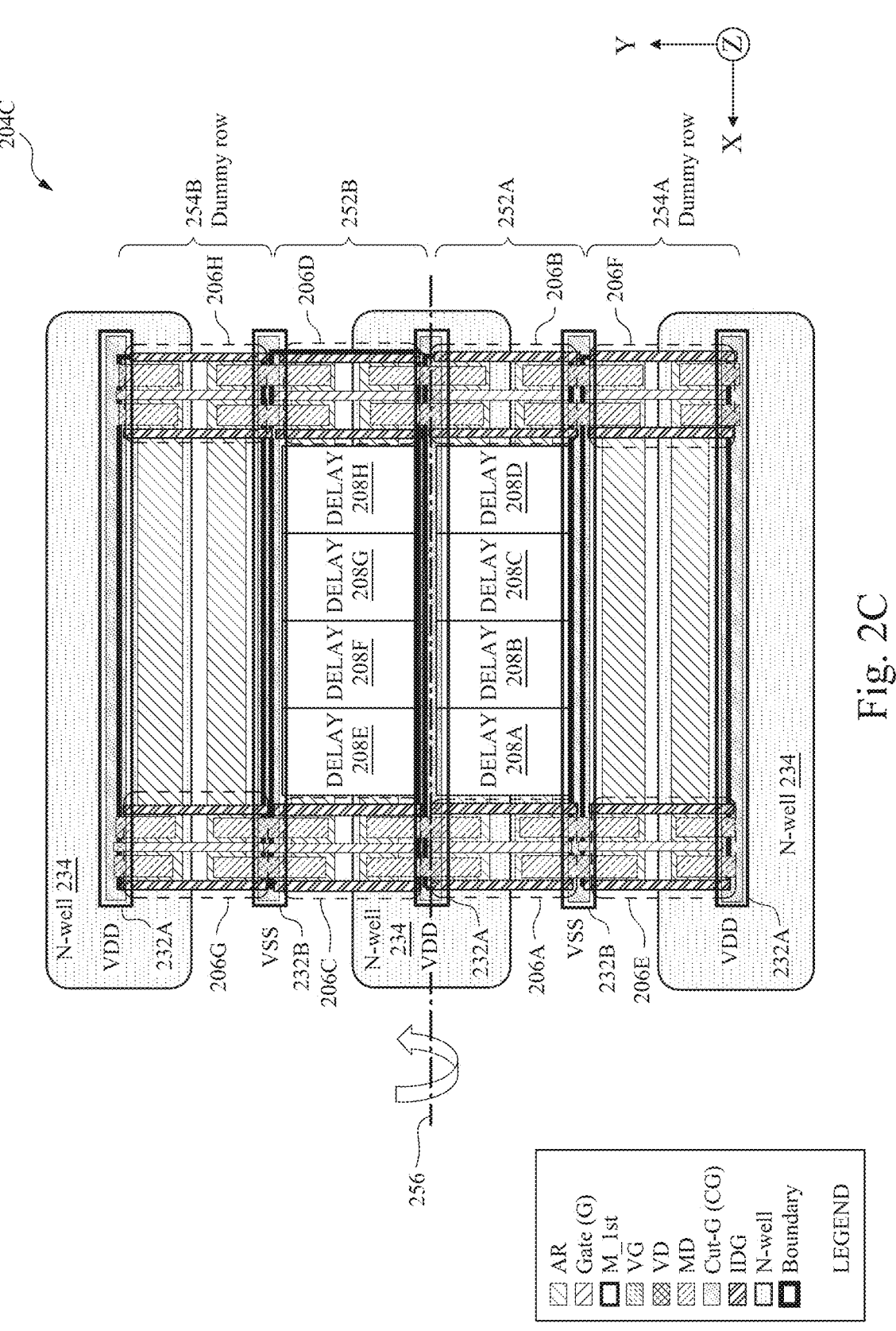

FIG. 2C is layout diagram of a semiconductor device 204C, in accordance with some embodiments.

In some embodiments, semiconductor device 204C is an example of semiconductor device 204A or semiconductor device 104E albeit with an additional row above delay row 152 of FIG. 1E.

Semiconductor device 204C of FIG. 2C is a version of semiconductor device 204A of FIG. 2A. In some respects, semiconductor device 204C of FIG. 2C is similar to semiconductor device 104E of FIG. 1E. For the sake of brevity, the discussion will focus on differences between FIG. 2C and FIG. 2A. As compared to FIG. 2A and relative to the Y-axis, semiconductor device 204C further includes: a dummy row 254A abutting a lower edge of delay row 252A; and a dummy row 254B abutting an upper edge of delay row 252B. Also as compared to FIG. 2A, semiconductor device 204C further includes: an instance of N-well 234 in which is located a PMOS AR of dummy row 254A; and an instance of N-well 234 in which is located a PMOS AR of dummy row 254B. In FIG. 2C and relative the Y-axis, a sequence of stacking from top to bottom is arranged as dummy row 254B, delay row 252B, delay row 252A and dummy row 254A.

Dummy row 254A includes dummy groups 206E and 206F. Dummy row 254B includes dummy groups 206G and 206H. Dummy rows 254A and 254B are counterparts of dummy rows 154A and 154B. Dummy rows 254A and 254B have a benefit of isolating an abutting row, e.g., corresponding delay rows 252A and 252B, from noise.

In FIG. 2C, relative to the X-axis, dummy groups 206E and 206G align with dummy groups 206A and 206C; and dummy groups 206F and 206H align with dummy groups 206D and 206B. Each of dummy rows 254A and 254B are without a delay cell in between the dummy groups.

Figure 2D:
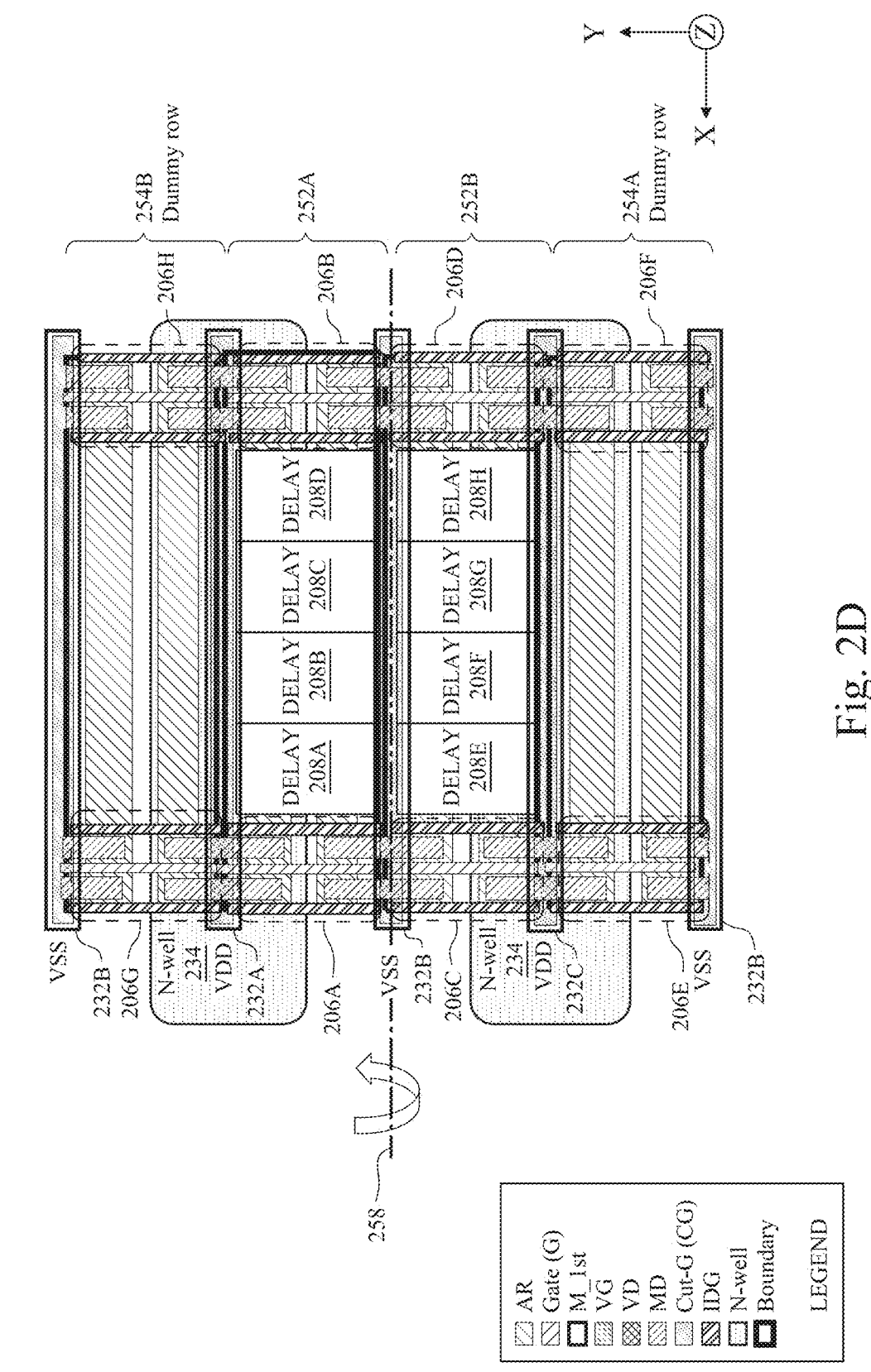

FIG. 2D is layout diagram of a semiconductor device 204D, in accordance with some embodiments.

Semiconductor device 204D of FIG. 2D is a version of semiconductor device 204B of FIG. 2B. For the sake of brevity, the discussion will focus on differences between FIG. 2D and FIG. 2B. As compared to FIG. 2B and relative to the Y-axis, semiconductor device 204D further includes: a dummy row 254A abutting a lower edge of delay row 252B; and a dummy row 254B abutting an upper edge of delay row 252A. Also as compared to FIG. 2B, semiconductor device 204D further includes: an instance of N-well 234 in which is located a PMOS AR of dummy row 254A and a PMOS AR of delay row 252B; and an instance of N-well 234 in which is located a PMOS AR of dummy row 254B and a PMOS AR of delay row 252A. In FIG. 2D and relative the Y-axis, a sequence of stacking from top to bottom is arranged as dummy row 254B, delay row 252A, delay row 252B and dummy row 254A.

Figure 2E:
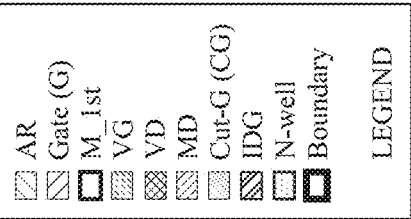

FIG. 2E is layout diagram of a semiconductor device 204E, in accordance with some embodiments.

Semiconductor device 204E of FIG. 2E is similar to semiconductor device 104E of FIG. 1E; for the sake of brevity, the discussion will focus on differences between FIG. 2E and FIG. 1E. As compared to FIG. 1E, FIG. 2E further includes four additional delay cells in the form of eight corresponding delay half-cells. In more detail, the eight delay half-cells include four PMOS delay half-cells 208_P1, 208_P2, 208_P3 and 208_P4, and four NMOS delay half-cells 208_N1, 208_N2, 208_N3 and 208_N4. Also, the arrangement of N-wells 234 in FIG. 2E is different than the arrangement of N-wells 123 in FIG. 1E, as discussed below.

Each of the four additional delay cells is a two-part delay cell. The four additional delay cells are represented by pairs of electrically connected corresponding PMOS delay half-cells and NMOS delay half-cells. More particularly, the four additional delay cells are represented by the following pairs of delay half-cells: 208_N1+208_P1; 208_N2+208_P2; 208_N3+208_P3; and 208_N4+208_P4. Semiconductor device 204E includes 2*δ 1-bit delay cells in a split-delay-cell arrangement, where δ=4.

Semiconductor device 204E of FIG. 2E further includes delay rows 264A and 264B as compared to FIG. 1E. In FIG. 2E and relative the Y-axis, a sequence of stacking from top to bottom is arranged as delay row 264A, delay row 252B and delay row 264B. Delay row 252B is an example of delay rows 252B of FIGS. 2A-2D. Delay row 264A includes dummy layer 260A and delay layer 262A that extend in the direction of the X-axis. Dummy layer 260A includes an upper portion of dummy group 206I and an upper portion of dummy group 206J, but dummy layer 260A is free from another dummy group or delay cell between the upper portions of dummy group 206I and dummy group 206J. Delay layer 262A includes a lower portion of dummy group 206I, delay half-cell 208_N1, delay half-cell 208_N2, delay half-cell 208_N3, delay half-cell 208_N4, and a lower portion of dummy group 206J.

Delay row 264B includes dummy layer 260B and delay layer 262B that extend in the direction of the X-axis. Dummy layer 260B includes a lower portion of dummy group 206K and a lower portion of dummy group 206L, but dummy layer 260B is free from another dummy group or delay cell between the lower portions of dummy group 206K and dummy group 206L. Delay layer 262B includes an upper portion of dummy group 206K, delay half-cell 208_P1, delay half-cell 208_P2, delay half-cell 208_P3, delay half-cell 208_P4, and an upper portion of dummy group 206L.

Each of delay half-cells 208_N1, 208_N2, 208_N3, and 208_N4 includes n-type transistors. In a non-limiting example, delay half-cell 208_N1 includes transistors N0, N1, and N2 of FIG. 1B, delay half-cell 208_N2 includes transistors N3, N4, N5 and N6, delay half-cell 208_N3 includes transistors N7, N8, N9, and N10, and delay half-cell 208_N4 includes transistors N11, N12, and N13. Continuing the example, the lower portion of each of dummy groups 206I and 206J includes dummy transistors DN1 and DN2. Dummy groups 206I and 206J are like dummy groups 206A through 206D.

Each of delay half-cells 208_P1, 208_P2, 208_P3, and 208_P4 includes p-type transistors. In a non-limiting example, delay half-cell 208_P1 includes transistors P0, P1, and P2 of FIG. 1B, delay half-cell 208_P2 includes transistors P3, P4, P5 and P6, delay half-cell 208_P3 includes transistors P7, P8, P9, and P10, and delay half-cell 208_P4 includes transistors P11, P12, and P13. Continuing the example, the lower portion of each of dummy groups 206K and 206L includes dummy transistors DP1 and DP2. Dummy groups 206K and 206L are examples of dummy groups 206A through 206D.

Relative to the Y-axis, delay row 264A abuts an upper edge of delay row 252B; more particularly, a lower edge of delay layer 262A abuts the upper edge of delay row 252B. Relative to the Y-axis, delay row 264B abuts a lower edge of delay row 252B; more particularly, an upper edge of delay layer 262B abuts a lower edge of delay row 252B.

FIG. 2E includes two instances of N-well 234 albeit in different locations than the two instances of N-well 234 in FIG. 1E. In more detail, FIG. 2E includes: an instance of N-well 234 in which are located a PMOS AR of delay row 252B and a PMOS AR of delay layer 262B of delay row 264B; and an instance of N-well 234 in which is located a PMOS AR of dummy layer 260A of delay row 264A.

Figure 2F:
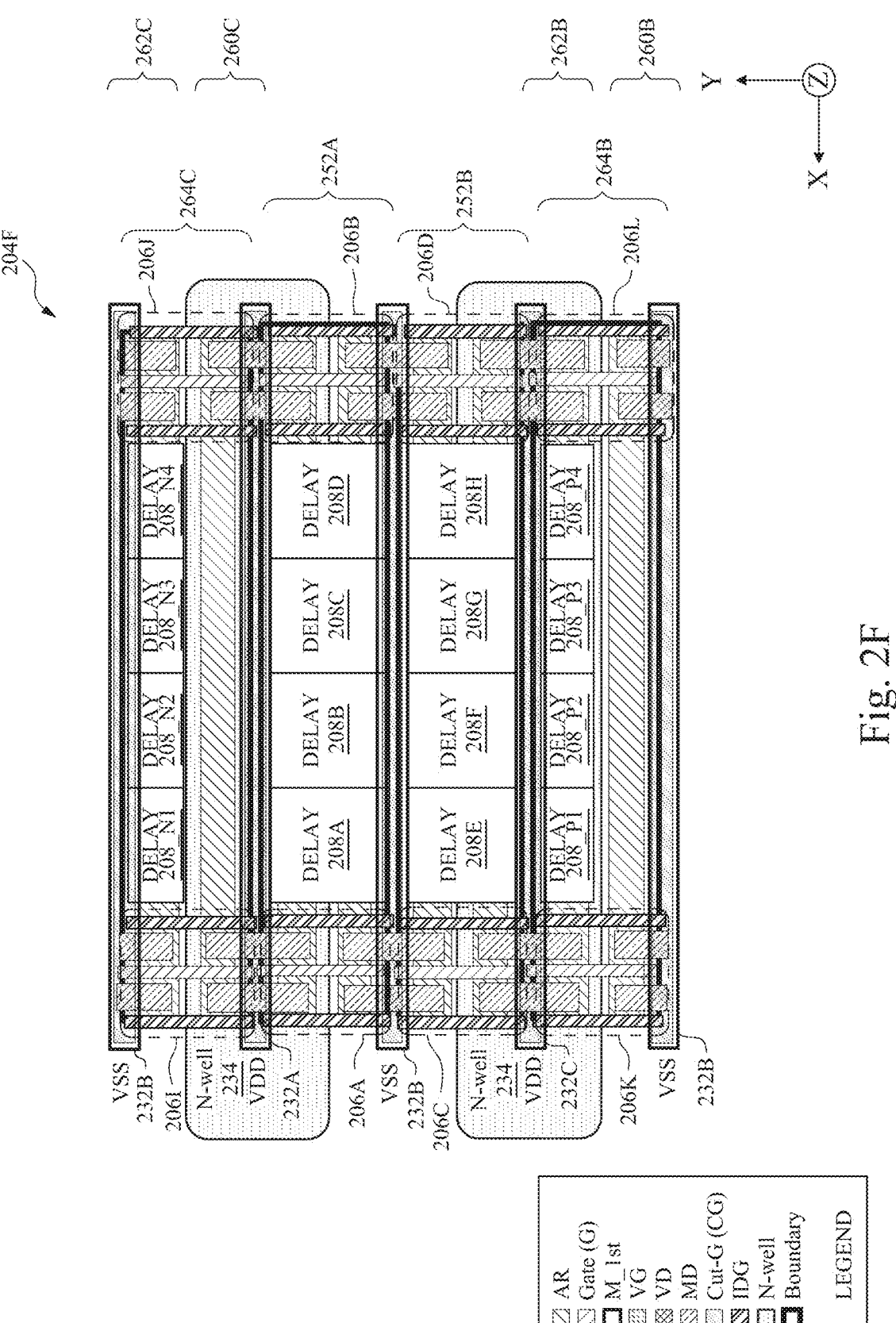

FIG. 2F is layout diagram of a semiconductor device 204F, in accordance with some embodiments.

Semiconductor device 204F of FIG. 2F is similar to semiconductor device 204C of FIG. 2C; for the sake of brevity, the discussion will focus on differences between FIG. 2F and FIG. 2C. As compared to FIG. 2C, FIG. 2F further includes four additional delay cells in the form of eight corresponding delay half-cells. In more detail, the eight delay half-cells include four PMOS delay half-cells 208_P1, 208_P2, 208_P3 and 208_P4, and four NMOS delay half-cells 208_N1, 208_N2, 208_N3 and 208_N4. Also, the number and arrangement of N-wells 234 in FIG. 2F is different than in FIG. 2C, as discussed below.

The four additional delay cells are represented by pairs of electrically connected corresponding PMOS delay half-cells and NMOS delay half-cells. More particularly, the four additional delay cells are represented by the following pairs of delay half-cells: 208_N1+208_P1; 208_N2+208_P2;

208_N3+208_P3; and 208_N4+208_P4. Semiconductor device 204F includes 3*δ 1-bit delay cells in a split-delay-cell arrangement, where δ=4.

Relative to the Y-axis, and in sequence from top to bottom, FIG. 2F includes delay rows 264C, 252A, 252B and 264B. Delay row 264C corresponds in location to dummy row 254B of FIG. 2C. Delay row 264C includes a dummy layer 260A and a delay layer 262A. Dummy layer 260A includes a lower portion of dummy group 206I and a lower portion of dummy group 206J, but dummy layer 260A is free from another dummy group or delay cell between the portions of dummy group 206I and dummy group 206J. Delay layer 262A includes an upper portion of dummy group 206I, delay half-cell 208_N1, delay half-cell 208_N2, delay half-cell 208_N3, delay half-cell 208_N4, and an upper portion of dummy group 206J.

In FIG. 2F, delay row 264B includes a dummy layer 260B and a delay layer 262B. Dummy layer 260B of delay row 264B includes a lower portion of dummy group 206K and a lower portion of dummy group 206L, but dummy layer 260B is free from another dummy group or delay cell between the portions of dummy group 206K and dummy group 206L. Delay layer 262B of delay row 264B includes an upper portion of dummy group 206K, delay half-cell 208_P1, delay half-cell 208_P2, delay half-cell 208_P3, delay half-cell 208_P4, and an upper portion of dummy group 206L.

Figure 2G:
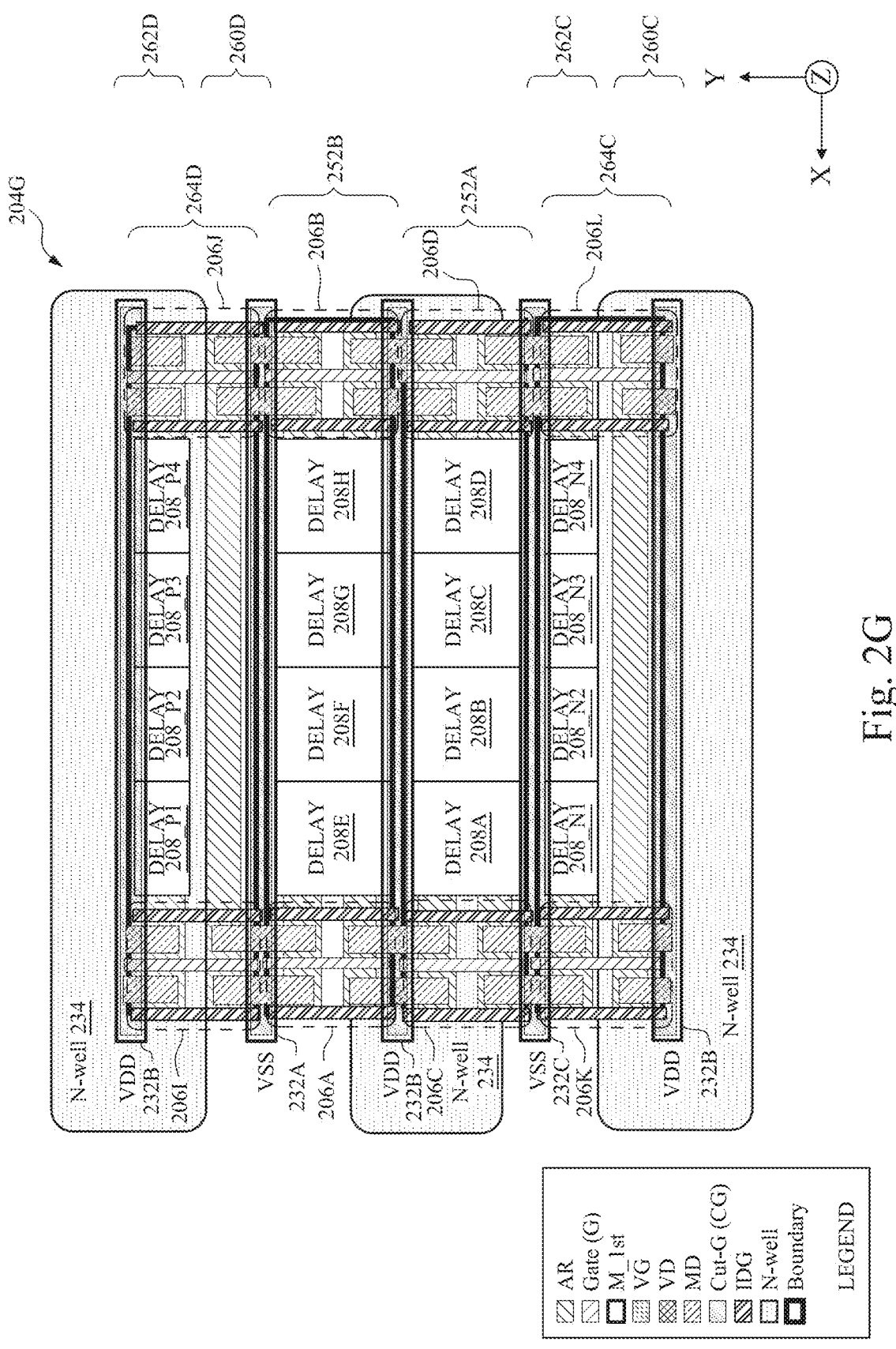

FIG. 2G is layout diagram of a semiconductor device 204G, in accordance with some embodiments.

Semiconductor device 204G of FIG. 2G is a version of semiconductor device 204F of FIG. 2F. As in FIG. 2F, semiconductor device 204G of FIG. 2G includes 3*δ 1-bit delay cells in a split-delay-cell arrangement, where δ=4. Relative to the Y-axis, and in sequence from top to bottom, FIG. 2G includes delay rows 264D, 252B, 252A and 264C. For the sake of brevity, the discussion will focus on differences between FIG. 2G and FIG. 2F. Relative to the Y-axis, delay row 252B is stacked on delay row 252A in FIG. 2G whereas delay row 252A is stacked on delay row 252B in FIG. 2F.

The PMOS and NMOS ARs are arranged differently in FIG. 2G as compared to FIG. 2F. Rather than the two instances of N-well 234 in FIG. 2F, instead FIG. 2G has three instances of N-well 234. More particularly, FIG. 2G includes: an instance of N-well 234 in which are located a PMOS AR of delay row 252A and a PMOS AR of delay row 252B; an instance of N-well 234 in which is located a PMOS AR of delay layer 262D of delay row 264D; and an instance of N-well 234 in which is located a PMOS AR of dummy layer 260C of delay row 264C.

Whereas delay layer 262A of delay row 264C of FIG. 2F has an NMOS AR, delay layer 262B of delay row 264D of FIG. 2G has a PMOS AR. Whereas delay layer 262B of delay row 264B of FIG. 2F has a PMOS AR, delay layer 262A of delay row 264C of FIG. 2G has an NMOS AR. Dummy layer 260B of delay row 264D includes a lower portion of dummy group 206I and a lower portion of dummy group 206J, but dummy layer 260B is free from another dummy group or delay cell between the portions of dummy group 206I and dummy group 206J. Delay layer 262B of delay row 264D includes an upper portion of dummy group 206I, delay half-cell 208_P1, delay half-cell 208_P2, delay half-cell 208_P3, delay half-cell 208_P4, and an upper portion of dummy group 206J. Dummy layer 260A of delay row 264C includes a lower portion of dummy group 206K and a lower portion of dummy group 206L, but dummy layer 260A is free from another dummy group or delay cell between the portions of dummy group 206K and dummy group 206L. Delay layer 262A of delay row 264C includes an upper portion of dummy group 206K, delay half-cell 208_N1, delay half-cell 208_N2, delay half-cell 208_N3, delay half-cell 208_N4, and an upper portion of dummy group 206L.

Regarding N-well 234, FIG. 2F includes two instances whereas FIG. 2C includes three instances. In more detail, FIG. 2F includes: an instance of N-well 234 in which are located a PMOS AR of delay row 252B and a PMOS AR of delay layer 262B of delay row 264B; and an instance of N-well 234 in which is located a PMOS AR of delay row 252A and a PMOS AR of dummy layer 260A of delay row 264A.

Figure 3A:
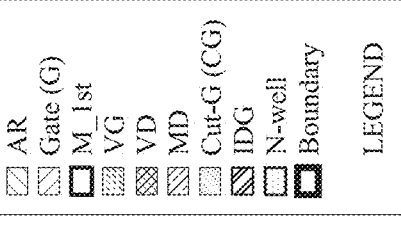
FIGS. 3A and 3B are layout diagrams of a semiconductor device, in accordance with some embodiments.

FIG. 3A is layout diagram of a semiconductor device 304A, in accordance with some embodiments.

Semiconductor device 304A of FIG. 3A is a version of semiconductor device 204A of FIG. 2A. Semiconductor device 304A differs from semiconductor device 204A in that semiconductor device 304A is configured with an extra row as compared to semiconductor device 204A, namely delay row 352C. Relative to the Y-axis, and in sequence from top to bottom, FIG. 3A includes delay rows 352A, 352B and 352C. Semiconductor device 304A includes 3*δ 1-bit delay cells, namely delay cells 308A-308I, arranged in three rows whereas semiconductor device 204A includes 2*δ 1-bit delay cells arranged in two rows, where δ=4. Also as compared to FIG. 2A, semiconductor device 304A further includes: an instance of N-well 334 in which is located a PMOS AR of delay row 352C.

Delay row 352A is an example of delay rows 252A and 152A. Delay row 352B is an example of delay rows 252B and 152B. Thus, discussion of the structure of rows 352A, 352B and 352C is left out for the sake of brevity. Relative to the Y-axis, an upper edge of delay row 352C abuts a lower edge of delay row 352B.

Figure 3B:
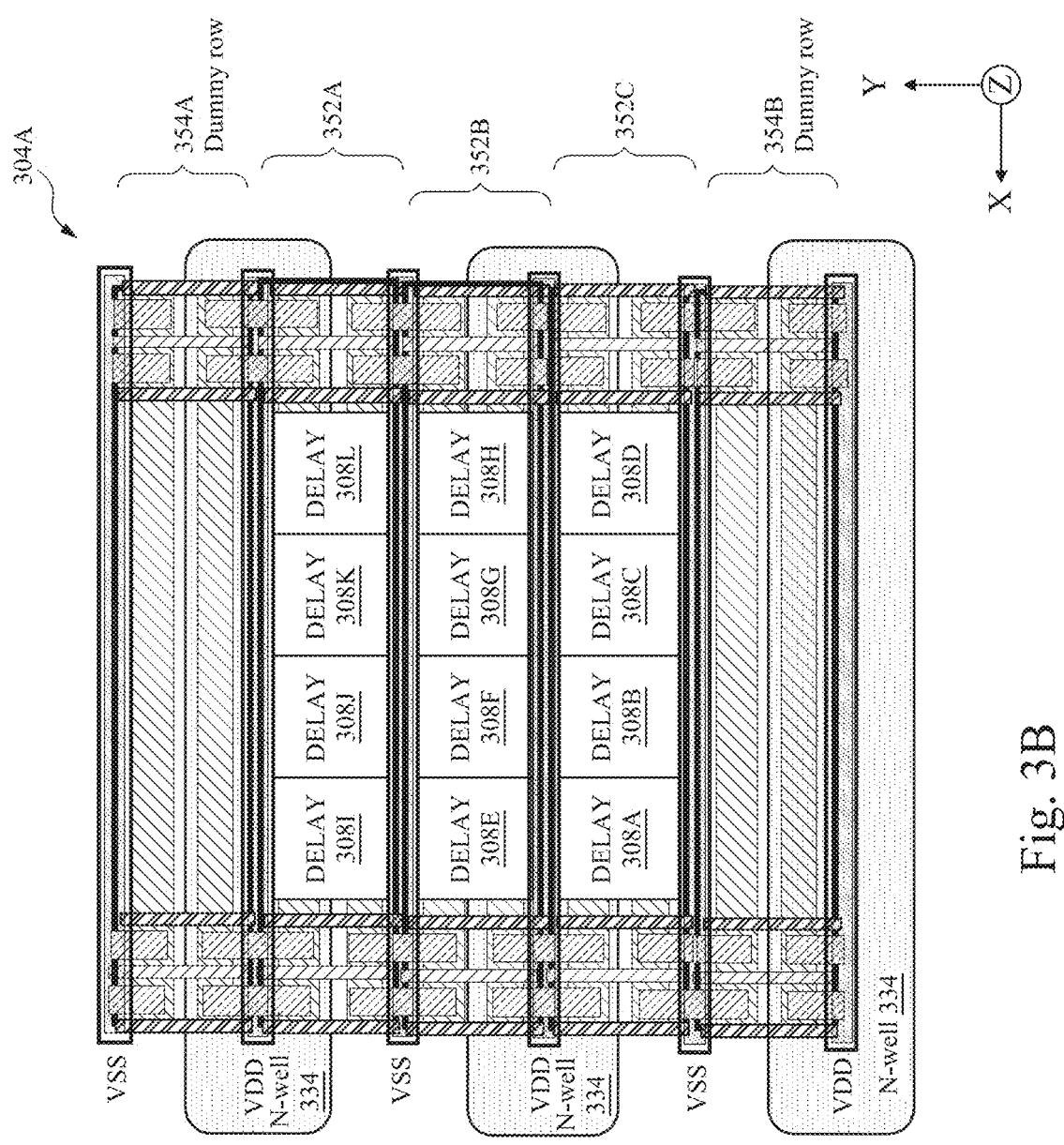

FIG. 3B is layout diagram of a semiconductor device 304B, in accordance with some embodiments.

Semiconductor device 304B of FIG. 3B is a version of semiconductor device 304A of FIG. 3A. FIG. 3B relates to FIG. 3A in a similar manner to how FIG. 2C relates to FIG. 2A. For the sake of brevity, the discussion will focus on differences between FIG. 3B and FIG. 3A. As compared to FIG. 3A and relative to the Y-axis, semiconductor device 304B further includes: a dummy row 354B abutting a lower edge of delay row 352A; and a dummy row 354A abutting an upper edge of delay row 352C. Relative to the Y-axis, and in sequence from top to bottom, FIG. 3B includes dummy row 354A, delay rows 352A, 352B and 352C, and dummy row 354B. Also as compared to FIG. 3A, semiconductor device 304B further includes: an instance of N-well 334 in which is located a PMOS AR of dummy row 354B. Regarding the instance of N-well 334 in which is located a PMOS AR of delay row 352C, also located therein is a PMOS AR of dummy row 354A.

In FIG. 3B, dummy row 354B is an example of dummy rows 254A of FIGS. 2C and 154A of FIG. 1E. Dummy row 354A is an example of dummy rows 254B of FIGS. 2C and 154B of FIG. 1E. As such, dummy rows 354A and 354B isolate delay rows 352A-352C from noise. Further discussion of dummy rows 354A and 354B is omitted for the sake of brevity.

Figure 4A:
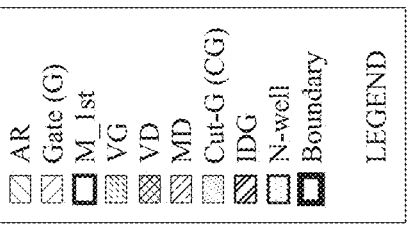
FIGS. 4A, 4B, and 4C are layout diagrams of a semiconductor device, in accordance with some embodiments.

FIG. 4A is layout diagram of a semiconductor device 404A, in accordance with some embodiments.

Semiconductor device 404A of FIG. 4A is a version of semiconductor device 304A of FIG. 3A. Semiconductor device 404A differs from semiconductor device 304A in that semiconductor device 404A is configured with an extra delay row as compared to semiconductor device 304A. Relative to the Y-axis, and in sequence from top to bottom, FIG. 4A includes delay rows 452D, 452A, 452B and 452C. Semiconductor device 404A includes 4*δ 1-bit delay cells, namely delay cells 408A-408H, arranged in four rows with δ=2 in FIG. 4A whereas semiconductor device 304A includes 3*δ 1-bit delay cells arranged in three rows with δ=4 in FIG. 3A.

Figure 4B:
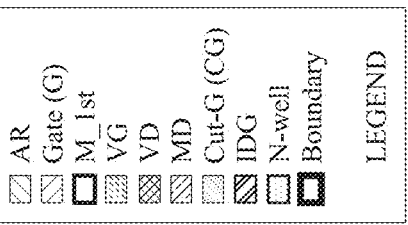

FIG. 4B is layout diagram of a semiconductor device 404B, in accordance with some embodiments.

Semiconductor device 404B of FIG. 4B is a version of semiconductor device 304A of FIG. 3A. Semiconductor device 404B differs from semiconductor device 304A in that semiconductor device 404A is configured with two dummy rows and an extra delay row as compared to semiconductor device 304A. Relative to the Y-axis, and in sequence from top to bottom, FIG. 4B includes dummy row 454A, delay rows 452A, 452B, 452C and 452D, and dummy row 454B. Semiconductor device 404B includes 4*δ 1-bit delay cells arranged in three rows with δ=2 in FIG. 4B whereas semiconductor device 304A includes 3*δ 1-bit delay cells arranged in three rows with δ=4 in FIG. 3A.

Relative to the Y-axis, dummy row 454B abuts a lower edge of delay row 452D; and a dummy row 454A abuts an upper edge of delay row 452A. Also as compared to FIG. 3A, semiconductor device 404B further includes: an instance of N-well 334 in which is located a PMOS AR of dummy row 454B and a PMOS AR of delay row 452D. Regarding the stack of delay rows relative to the Y-axis, the location of delay row 452D in FIG. 4B is flipped with respect to the location of delay row 452D in FIG. 4A. That is, delay row 452D is at the bottom of the delay-row-stack in FIG. 4B whereas delay row 452D is at the top of the delay-row-stack in FIG. 4A.

Dummy row 454A is an example of dummy row 154B of FIG. 1E, and 354A of FIG. 3B. Dummy row 454B is an example of 254A of FIG. 2D.

Figure 4C:
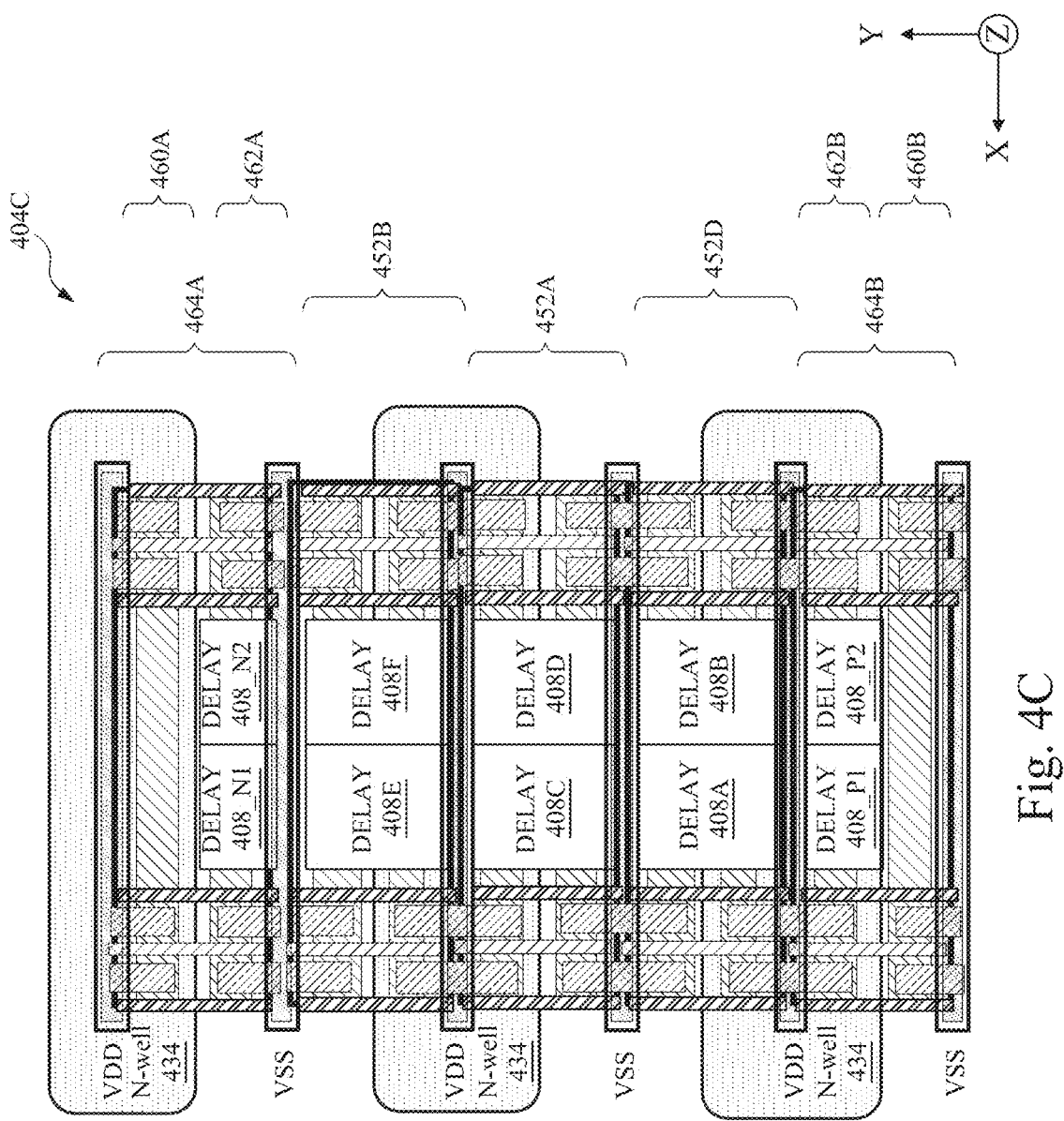

FIG. 4C is layout diagram of a semiconductor device 404C, in accordance with some embodiments.

Semiconductor device 404C of FIG. 4C is a version of semiconductor device 404B of FIG. 4B. Semiconductor device 404C differs from semiconductor device 404B as follows: delay row 464A of FIG. 4C replaces dummy row 454A and delay row 452A of FIG. 4B; and delay row 464B of FIG. 4C replaces dummy row 454B of FIG. 4B. In other words, the two delay cells of delay row 452A of FIG. 4B are replaced in FIG. 4C with delay cells 408E and 408F of delay row 452A of FIG. 4B are replaced in FIG. 4C with two two-part delay cells represented by the following pairs of electrically connected delay half-cells: 408_N1+408_P1; and 408_N2+408_P2. Semiconductor device 404C includes 4*δ 1-bit delay cells in a split-delay-cell arrangement, where δ=2.

Relative to the Y-axis, delay row 464B abuts a lower edge of delay row 452D; and delay row 464A abuts an upper edge of delay row 452B. Delay row 464A includes dummy layer 460A and delay layer 462A. Delay row 464B includes dummy layer 460B and delay layer 462B. Dummy layers 460A and 460B of FIG. 4C are like dummy layers 260A and 260B of FIG. 2E in that there are no dummy groups or delay cells between the dummy groups at the end of delay rows 464A and 464B. Mindful that δ=2 in FIG. 4C whereas δ=4 in FIG. 2E, delay layers 462A and 462B of FIG. 4C are like delay layers 262A and 262B of FIG. 2E.

Figure 5A:
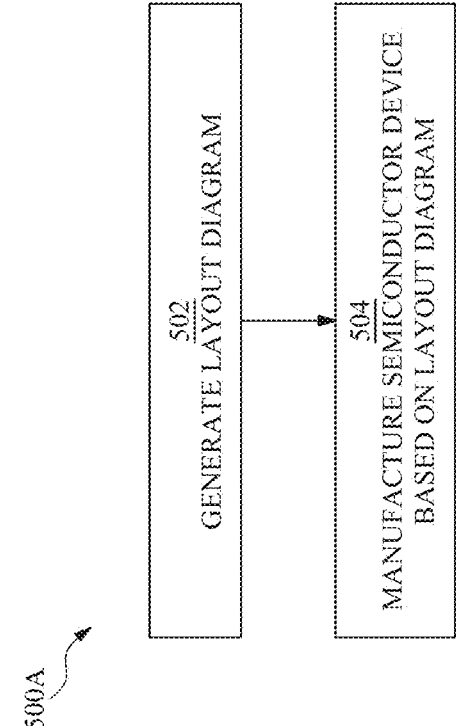

FIG. 5A is a flow diagram of method 500A of manufacturing a semiconductor device, in accordance with some embodiments.

In FIG. 5A, the method 500A includes blocks 502-504. At block 502, a layout diagram is generated which, among other things, includes one or more of layout diagrams disclosed herein, or the like. Block 502 is implementable, for example, using EDA system 600 (FIG. 6, discussed below), in accordance with some embodiments. From block 502, flow proceeds to block 504.

At block 504, based on the layout diagram, at least one of (A) one or more photolithographic exposures are made or (b) one or more semiconductor masks are fabricated or (C) one or more components in a layer of a semiconductor device are fabricated. See discussion below of IC manufacturing system 700 in FIG. 7 below.

FIG. 5B is a flow diagram of method 500B of forming a semiconductor device, in accordance with some embodiments.

Method 500B includes blocks 508-516. At block 508, active regions (ARs) are formed in a substrate including doping corresponding areas of the substrate. An example of the substrate is substrate region 139 in FIGS. 1F-1H, or the like. Examples of the active regions include ARs 138(A)-(B) or the like. From block 508, flow proceeds to block 510.

At block 510, source/drain (S/D) regions representing first transistor components (TCs) are formed in the ARs including doping corresponding first areas of the active regions, where in second areas of the ARs which are between corresponding S/D regions are channel regions representing second TCs. Examples of channel regions include areas of corresponding ARs which are between gate lines as in FIG. 1D, or the like. From block 510, flow proceeds to block 512.

At block 512, gate lines representing third TCs are formed over corresponding ones of the channel regions. Examples of the gate lines include gate lines 140, the gate lines in FIG. 1D, or the like. From block 512, flow proceeds to block 514.

At block 514, metal-to-S/D (MD) contact structures representing 4th TCs are formed over corresponding S/D regions. Examples of MD contact structures include MD contact structures 144 of FIG. 1D, or the like. Block 514 results in: a first set of the first to fourth transistor-components that lack connections to the first and third transistor-components which otherwise would be indicative of configurations as active transistors such that the first to fourth transistor-components of the first set represent one or more corresponding dummy transistors that define a first dummy group; and a second set of the first to fourth transistor-components that lack connections to the first and third transistor-components which otherwise would be indicative of configurations as active transistors such that the first to fourth transistor-components of the second set represent one or more corresponding dummy transistors that define a second dummy group. From block 514, flow proceeds to block 516.

At block 516, interconnection structures representing fifth TCs are formed over corresponding ones of the gate lines and the MD contact structures. Examples of the interconnection structures include MG contact structures 145, VG contact structures 148 and VD contact structures 146 in FIGS. 1F-1G. Block 516 results in: a third set of the first to fifth transistor-components connected as one or more corresponding active transistors that define a first delay cell; and a fourth set of the first to fifth transistor-components connected as one or more corresponding active transistors that define a second delay cell.

Also, relative to a first direction: the first and second dummy groups and the first and second delay cells are in a first row that extends in the first direction, the first row having a first sequence arranged as the first dummy group, the first delay cell, the second delay cell, and the second dummy group; and the first and second delay cells are free from having another dummy group therebetween. In some embodiments, the first sequence is an open sequence. An example of an open sequence is the sequence of the row of FIG. 1D, which is arranged as 106A:108A:108B:108C:108D:106B, or the like. An example of the delay cells being free from having another dummy group therebetween is delay row 152 that includes dummy group 106A, delay cell 108A, delay cell 108D, and dummy group 106B.

Regarding embodiments in which the flowchart of FIG. 5B results in a delay arrangement between otherwise serially connected first and second flip flops, examples of the delay arrangement include the delay arrangements of FIGS. 1A-1B, delay arrangements based on the layout diagrams of FIGS. 1C-1E, 2A-2G, 3A-3B, 4A-4C, or the like.

Figure 6:
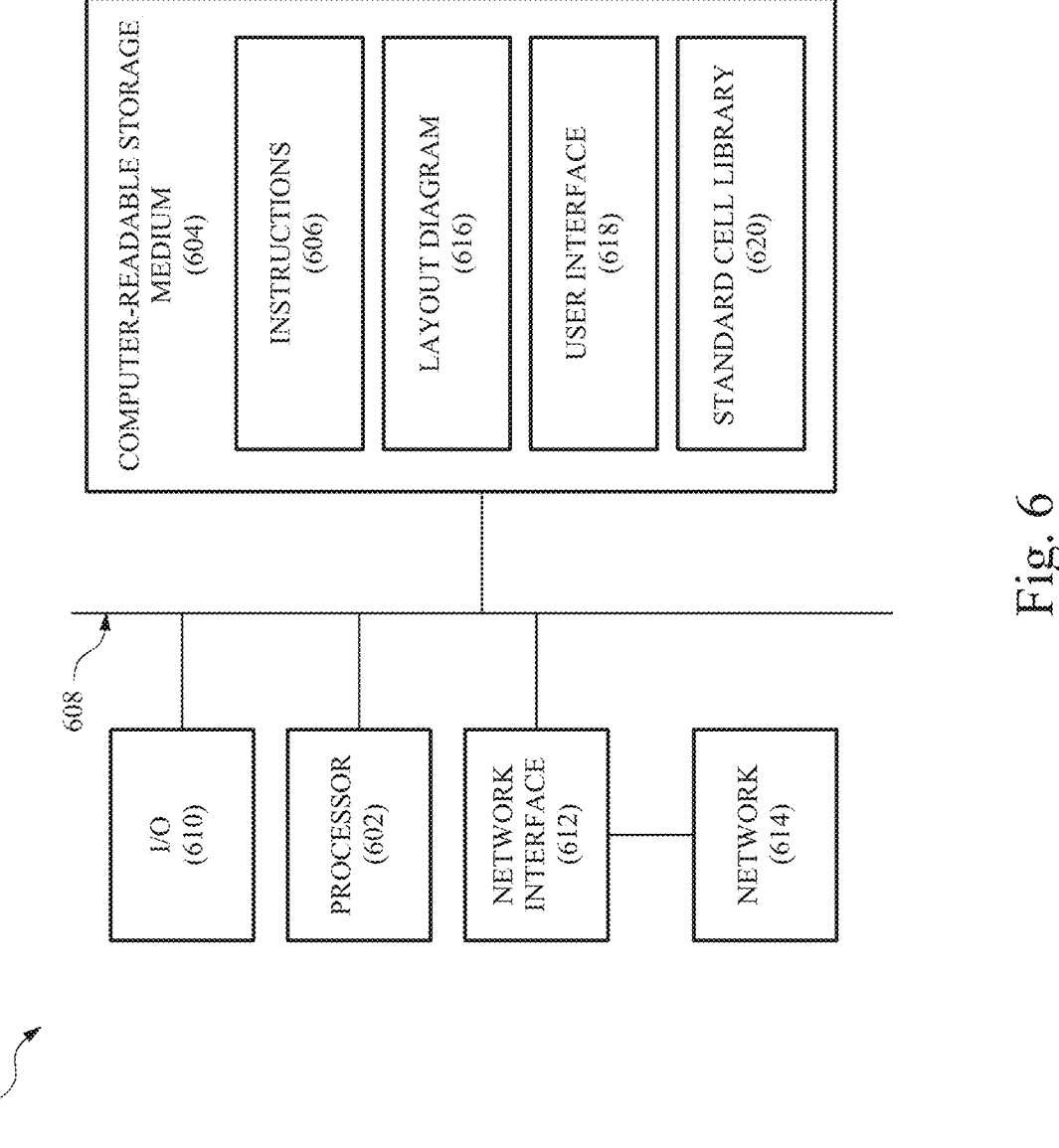
FIG. 6 is a block diagram of an electronic design automation (EDA) system, in accordance with some embodiments.

FIG. 6 is a block diagram of an electronic design automation (EDA) system 600 in accordance with some embodiments.

In some embodiments, EDA system 600 includes an APR system. The method 500A of FIG. 5A is implemented, for example, using EDA system 600, in accordance with some embodiments.

In some embodiments, EDA system 600 is a general-purpose computing device including a hardware processor 602 and a non-transitory, computer-readable storage medium 604. Storage medium 604, amongst other things, is encoded with, i.e., stores, computer program instructions 606, i.e., a set of executable instructions. Execution of instructions 606 by hardware processor 602 represents (at least in part) an EDA tool which implements a portion or all, e.g., the method of FIG. 5A, or the like, in accordance with one or more embodiments (hereinafter, the noted processes and/or methods). Storage medium 604, amongst other things, stores layout diagram 616 that includes layout diagrams of FIGS. 1D, 1E, 2A, 2B, 2C, 2D, 2E, 2F, 2G, 3A, 3B, 4A, 4B, and 4C, or the like.

Processor 602 is electrically coupled to computer-readable storage medium 604 via a bus 608. Processor 602 is further electrically coupled to an I/O interface 610 by bus 608. A network interface 612 is further electrically connected to processor 602 via bus 608. Network interface 612 is connected to a network 614, so that processor 602 and computer-readable storage medium 604 connect to external elements via network 614. Processor 602 is configured to execute computer program instructions 606 encoded in computer-readable storage medium 604 to cause system 600 to be usable for performing a portion or all the noted processes and/or methods. In one or more embodiments, processor 602 is a central processing unit (CPU), a multi-processor, a distributed processing system, an application specific integrated circuit (ASIC), and/or a suitable processing unit.

In one or more embodiments, computer-readable storage medium 604 is an electronic, magnetic, optical, electromagnetic, infrared, and/or a semiconductor system (or apparatus or device). For example, computer-readable storage medium 604 includes a semiconductor or solid-state memory, a magnetic tape, a removable computer diskette, a random-access memory (RAM), a read-only memory (ROM), a rigid magnetic disk, and/or an optical disk. In one or more embodiments using optical disks, computer-readable storage medium 604 includes a compact disk-read only memory (CD-ROM), a compact disk-read/write (CD-R/W), and/or a digital video disc (DVD).

In one or more embodiments, storage medium 604 stores computer program instructions 606 configured to cause system 600 (where such execution represents (at least in part) the EDA tool) to be usable for performing a portion or all the noted processes and/or methods. In one or more embodiments, storage medium 604 further stores information which facilitates performing a portion or all the noted processes and/or methods. In one or more embodiments, storage medium 604 stores library 620 of standard cells including such standard cells as disclosed herein.

EDA system 600 includes I/O interface 610. I/O interface 610 is coupled to external circuitry. In one or more embodiments, I/O interface 610 includes a keyboard, keypad, mouse, trackball, trackpad, touchscreen, and/or cursor direction keys for communicating information and commands to processor 602.

EDA system 600 further includes network interface 612 coupled to processor 602. Network interface 612 allows system 600 to communicate with network 614, to which one or more other computer systems are connected. Network interface 612 includes wireless network interfaces such as BLUETOOTH, WIFI, WIMAX, GPRS, or WCDMA; or wired network interfaces such as ETHERNET, USB, or IEEE-1364. In one or more embodiments, a portion or all noted processes and/or methods, is implemented in two or more systems 600.

System 600 is configured to receive information through I/O interface 610. The information received through I/O interface 610 includes one or more of instructions, data, design rules, libraries of standard cells, and/or other parameters for processing by processor 602. The information is transferred to processor 602 via bus 608. EDA system 600 is configured to receive information related to a UI through I/O interface 610. The information is stored in computer-readable medium 604 as user interface (UI) 618.

In some embodiments, a portion or all the noted processes and/or methods is implemented as a standalone software application for execution by a processor. In some embodiments, a portion or all the noted processes and/or methods is implemented as a software application that is a part of an additional software application. In some embodiments, a portion or all the noted processes and/or methods is implemented as a plug-in to a software application. In some embodiments, at least one of the noted processes and/or methods is implemented as a software application that is a portion of an EDA tool. In some embodiments, a portion or all the noted processes and/or methods is implemented as a software application that is used by EDA system 600. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, or the like.

Figure 7:
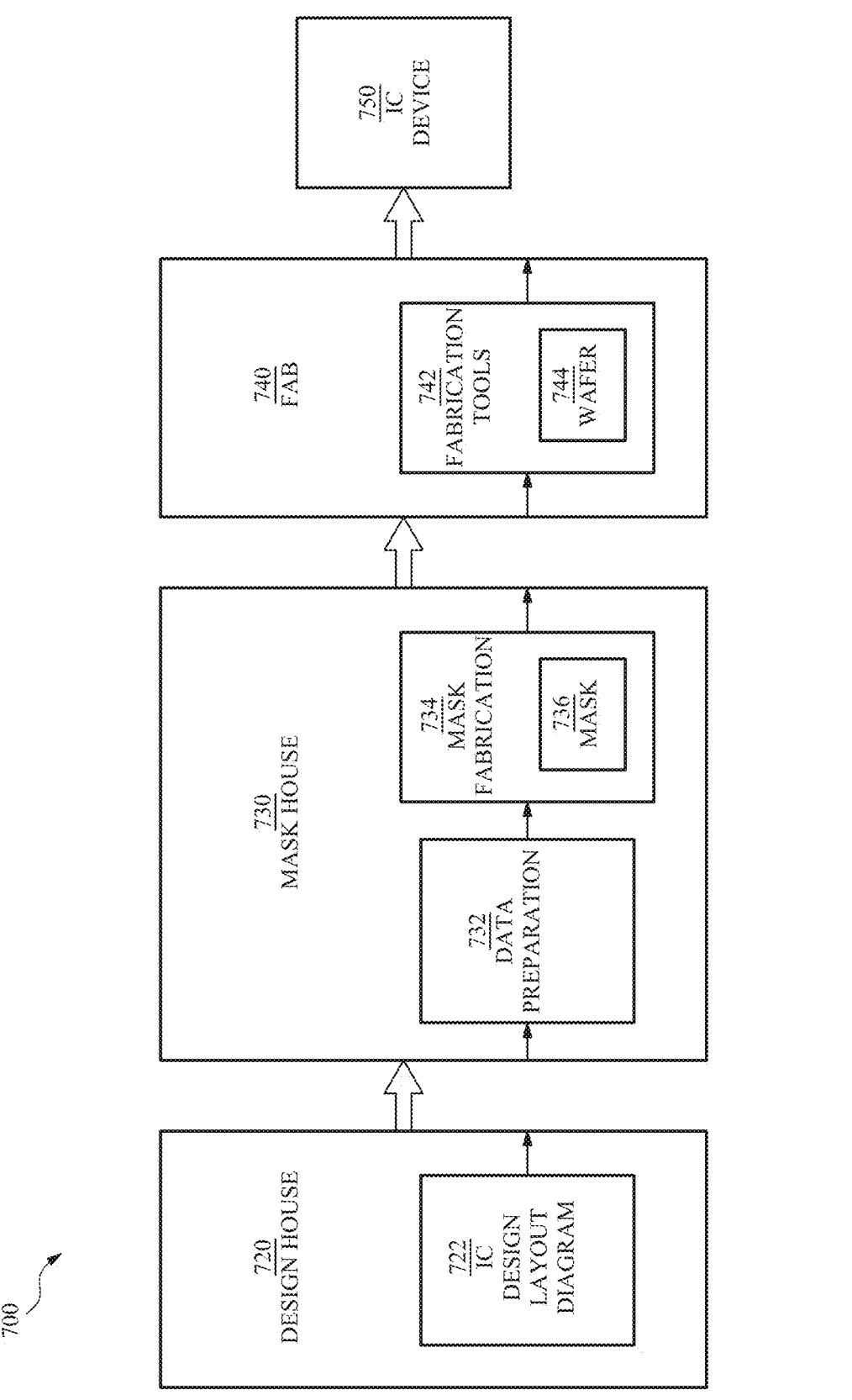
FIG. 7 is a block diagram of an integrated circuit (IC) manufacturing system, and an IC manufacturing flow associated therewith, in accordance with some embodiments.

FIG. 7 is a block diagram of an integrated circuit (IC) manufacturing system 700, and an IC manufacturing flow associated therewith, in accordance with some embodiments.

After block 504 of FIG. 5A, based on the layout, at least one of (A) one or more semiconductor masks or (B) at least one component in a layer of an inchoate semiconductor integrated circuit is fabricated using manufacturing system 700.

In FIG. 7, IC manufacturing system 700 includes entities, such as a design house 720, a mask house 730, and an IC manufacturer/fabricator ("fab") 740, that interact with one another in the design, development, and manufacturing cycles and/or services related to manufacturing an IC device 750. The entities in system 700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 720, mask house 730, and IC fab 740 is owned by a single larger company. In some embodiments, two or more of design house 720, mask house 730, and IC fab 740 coexist in a common facility and use common resources.

Design house (or design team) 720 generates an IC design layout 722. IC design layout 722 includes various geometrical patterns designed for an IC device 750. The geometrical patterns correspond to patterns of metal, oxide, or semiconductor layers that make up the various components of IC device 750 to be fabricated. The various layers combine to form various IC features. For example, a portion of IC design layout 722 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 720 implements a proper design procedure to form IC design layout 722. The design procedure includes one or more of logic design, physical design or place and route. IC design layout 722 is presented in one or more data files having information of the geometrical patterns. For example, IC design layout 722 is expressed in a GDSII file format or DFII file format.

Mask house 730 includes data preparation 732 and mask fabrication 734. Mask house 730 uses IC design layout 722 to manufacture one or more masks to be used for fabricating the various layers of IC device 750 according to IC design layout 722. Mask house 730 performs mask data preparation 732, where IC design layout 722 is translated into a representative data file ("RDF"). Mask data preparation 732 supplies the RDF to mask fabrication 734. Mask fabrication 734 includes a mask writer. A mask writer converts the RDF to an image on a substrate, such as a mask (reticle) or a semiconductor wafer. The design layout is manipulated by mask data preparation 732 to comply with characteristics of the mask writer and/or requirements of IC fab 740. In FIG. 7, mask data preparation 732, mask fabrication 734, and mask 736 are illustrated as separate elements. In some embodiments, mask data preparation 732 and mask fabrication 734 are collectively referred to as mask data preparation.

In some embodiments, mask data preparation 732 includes optical proximity correction (OPC) which uses lithography enhancement techniques to compensate for image errors, such as those that arise from diffraction, interference, other process effects or the like. OPC adjusts IC design layout 722. In some embodiments, mask data preparation 732 includes further resolution enhancement techniques (RET), such as off-axis illumination, sub-resolution assist features, phase-shifting masks, other suitable techniques, or the like or combinations thereof. In some embodiments, inverse lithography technology (ILT) is further used, which treats OPC as an inverse imaging problem.

In some embodiments, mask data preparation 732 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, or the like. In some embodiments, the MRC modifies the IC design layout to compensate for limitations during mask fabrication 734, which may undo part of the modifications performed by OPC to meet mask creation rules.

In some embodiments, mask data preparation 732 includes lithography process checking (LPC) that simulates processing that is implemented by IC fab 740 to fabricate IC device 750. LPC simulates this processing based on IC design layout 722 to fabricate a simulated manufactured device, such as IC device 750. The processing parameters in LPC simulation include parameters associated with various processes of the IC manufacturing cycle, parameters associated with tools used for manufacturing the IC, and/or other aspects of the manufacturing process. LPC considers various factors, such as aerial image contrast, depth of focus ("DOF"), mask error enhancement factor ("MEEF"), other suitable factors, or the like or combinations thereof. In some embodiments, after a simulated manufactured device has been fabricated by LPC, if the simulated device is not close enough in shape to satisfy design rules, OPC and/or MRC are be repeated to further refine IC design layout 722.

The above description of mask data preparation 732 has been simplified for the purposes of clarity. In some embodiments, data preparation 732 includes additional features such as a logic operation (LOP) to modify the IC design layout according to manufacturing rules. Additionally, the processes applied to IC design layout 722 during data preparation 732 may be executed in a variety of different orders.

After mask data preparation 732 and during mask fabrication 734, a mask 736 or a group of masks are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region, and transmits through transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 734 is used in a variety of processes. For example, such a mask(s) is used in an ion implantation process to form various doped regions in the semiconductor wafer, in an etching process to form various etching regions in the semiconductor wafer, and/or in other suitable processes.

IC fab 740 is an IC fabrication business that includes one or more manufacturing facilities for the fabrication of a variety of different IC products. In some embodiments, IC fab 740 is a semiconductor foundry. For example, there may be a manufacturing facility for the front-end fabrication of a plurality of IC products (front-end-of-line (FEOL) fabrication), while a second manufacturing facility may supply the back-end fabrication for the interconnection and packaging of the IC products (back-end-of-line (BEOL) fabrication), and a third manufacturing facility may supply other services for the foundry business.

IC fab 740 uses mask 736 (or masks) fabricated by mask house 730 to fabricate IC device 750 using fabrication tools 742. Thus, IC fab 740 at least indirectly uses IC design layout 722 to fabricate IC device 750. In some embodiments, a semiconductor wafer 744 is fabricated by IC fab 740 using the mask (or masks) to form IC device 750. Semiconductor wafer 744 includes a silicon substrate or other proper substrate having material layers formed thereon. Semiconductor wafer 744 further includes one or more of various doped regions, dielectric features, multilevel interconnects, or the like (formed at subsequent manufacturing steps).

In some embodiments, a method of forming a semiconductor device includes forming active regions, including doping areas of a substrate; forming source/drain (S/D) regions, including doping first areas of the active regions that represent first transistor-components with a result that second areas of the active regions between corresponding ones of the first areas are channel regions representing second transistor-components; forming gate lines representing third transistor-components over corresponding ones of the channel regions; forming metal-to-S/D (MD) contact structures representing fourth transistor-components over corresponding ones of the S/D regions, the MD contact structures defining: a first set of the first to fourth transistor-components that lack connections to the first and third transistor-components which otherwise would be indicative of configurations as active transistors such that the first to fourth transistor-components of the first set represent one or more corresponding dummy transistors that define a first dummy group; and a second set of the first to fourth transistor-components that lack connections to the first and third transistor-components which otherwise would be indicative of configurations as active transistors such that the first to fourth transistor-components of the second set represent one or more corresponding dummy transistors that define a second dummy group; and forming interconnection structures representing fifth transistor-components over corresponding ones of the gate lines and the MD contact structures, the interconnection structures defining: a third set of the first to fifth transistor-components connected as one or more corresponding active transistors that define a first delay cell in which: a basic inverter is configured to receive an input signal at a first node and output a first inverted signal at a second node, the first node representing an input node of the basic inverter; and a float-resistant inverter is configured to receive the first inverted signal at the second node and output a second inverted signal at a third node; a fourth set of the first to fifth transistor-components connected as one or more corresponding active transistors that define a second delay cell; and relative to a first direction: the first and second dummy groups and the first and second delay cells being in a first row that extends in the first direction, the first row having a first sequence arranged as the first dummy group, the first delay cell, the second delay cell, and the second dummy group; and the first and second delay cells being free from having another dummy group therebetween.

In some embodiments, a method of forming a semiconductor device includes forming one or more dummy transistors as a first dummy group; forming one or more dummy transistors as a second dummy group; forming one or more active transistors as a first delay cell in which: a basic inverter is configured to receive an input signal at a first node and output a first inverted signal at a second node, the first node representing an input node of the basic inverter; and a float-resistant inverter is configured to receive the first inverted signal at the second node and output a second inverted signal at a third node; and forming one or more active transistors as a second delay cell, wherein, relative to a first direction: the first and second dummy groups and the first and second delay cells are formed in a first row that extends in the first direction, the first row including at least the first dummy group, the first delay cell, the second delay cell, and the second dummy group in the stated order; and the first and second delay cells are free from having another dummy group therebetween.

In some embodiments, a method of forming a semiconductor device includes forming a first row of transistors that extends in a first direction on a semiconductor substrate, the first row of transistors including dummy transistors and active transistors, wherein: the first row includes, in a sequence from a first end to a second end of the first row, at least a first dummy group, a first delay cell, a second delay cell, and a second dummy group; the first dummy group is formed of one or more dummy transistors; the second dummy group is formed of one or more dummy transistors; the first delay cell is formed of active transistors configured as: a basic inverter operable to output a first inverted signal in response to receiving a first input signal; and a float-resistant inverter operable to output a second inverted signal in response to receiving the first inverted signal; the second delay cell is formed of active transistors configured as at least one inverter; and the first row is free of dummy transistors between the first delay cell and the second delay cell.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of forming a semiconductor device, the method comprising:

forming active regions, including doping areas of a substrate;

forming source/drain (S/D) regions, including doping first areas of the active regions that represent first transistor-components with a result that second areas of the active regions between corresponding ones of the first areas are channel regions representing second transistor-components;

forming gate lines representing third transistor-components over corresponding ones of the channel regions;

forming metal-to-S/D (MD) contact structures representing fourth transistor-components over corresponding ones of the S/D regions, the MD contact structures defining:

a first set of the first to fourth transistor-components that lack connections to the first and third transistor-components which otherwise would be indicative of configurations as active transistors such that the first to fourth transistor-components of the first set represent one or more corresponding dummy transistors that define a first dummy group; and a second set of the first to fourth transistor-components that lack connections to the first and third transistor-components which otherwise would be indicative of configurations as active transistors such that the first to fourth transistor-components of the second set represent one or more corresponding dummy transistors that define a second dummy group; and forming interconnection structures representing fifth transistor-components over corresponding ones of the gate lines and the MD contact structures, the interconnection structures defining:

a third set of the first to fifth transistor-components connected as one or more corresponding active transistors that define a first delay cell in which:

a basic inverter is configured to receive an input signal at a first node and output a first inverted signal at a second node, the first node representing an input node of the basic inverter; and a float-resistant inverter is configured to receive the first inverted signal at the second node and output a second inverted signal at a third node;

a fourth set of the first to fifth transistor-components connected as one or more corresponding active transistors that define a second delay cell; and relative to a first direction:

the first and second dummy groups and the first and second delay cells being in a first row that extends in the first direction, the first row having a first sequence arranged as the first dummy group, the first delay cell, the second delay cell, and the second dummy group; and the first and second delay cells being free from having another dummy group therebetween.

2. The method of claim 1, wherein:

the first sequence is open;

the forming interconnection structures further defines:

a batch of N sets of the first to fifth transistor-components connected as corresponding active transistors that define a batch of N delay cells, where N is a positive integer;

the batch of N delay cells is in the first row; and relative to the first direction:

the first sequence is further arranged as the first dummy group, the first delay cell, the batch of N delay cells, the second delay cell, and the second dummy group; and any two of the first and second delay cells and delay cells of the batch of N delay cells are free from having another dummy group being therebetween.

3. The method of claim 1, wherein:

the forming MD contact structures further defines:

a fifth set of the first to fourth transistor-components that lack connections to the first and third transistor-components which otherwise would be indicative of configurations as active transistors such that the first to fourth transistor-components of the fifth set represent corresponding dummy transistors that define a third dummy group; and a sixth set of the first to fourth transistor-components that lack connections to the first and third transistor-components which otherwise would be indicative of configurations as active transistors such that the first to fourth transistor-components of the sixth set represent one or more corresponding dummy transistors that define a fourth dummy group;

the third and fourth dummy groups are in a second row that extends in the first direction;

relative to the first direction, the third and fourth dummy groups are free from another dummy group being therebetween; and relative to a second direction perpendicular to the first direction, the second row abuts the first row.

4. The method of claim 3, wherein:

the forming interconnection structures further defines:

a seventh set of the first to fifth transistor-components connected as one or more corresponding active transistors that define a third delay cell; and an eighth set of the first to fifth transistor-components connected as one or more corresponding active transistors that define a fourth delay cell;

the third and fourth delay cells are in the second row; and relative to the first direction:

the second row has a second sequence arranged as the third dummy group, the third delay cell, the fourth delay cell, and the fourth dummy group; and the third delay cell and the fourth delay cell are free from having another dummy group therebetween.

5. The method of claim 3, wherein:

the forming interconnection structures further defines:

a seventh set of the first to fifth transistor-components connected as one or more corresponding active transistors of a first conductivity-type that define a first portion of a third delay cell; and an eighth set of the first to fifth transistor-components connected as one or more corresponding active transistors of the first conductivity-type that define a first portion of a fourth delay cell;

the second row includes first and second layers that extend in the first direction; and relative to the second direction:

the first layer of the second row includes a first portion of the third dummy group, a first portion of the second dummy group, the first portion of the third delay cell, and the first portion of the fourth delay cell;

the second layer of the second row includes a second portion of the first dummy group and a second portion of the second dummy group but is free from another dummy group or delay cell being between the second portions of the first and second dummy groups; and the first layer of the second row abuts the first row.

6. A method of forming a semiconductor device, the method comprising:

forming one or more dummy transistors as a first dummy group;

forming one or more dummy transistors as a second dummy group;

forming one or more active transistors as a first delay cell in which:

a basic inverter is configured to receive an input signal at a first node and output a first inverted signal at a second node, the first node representing an input node of the basic inverter; and a float-resistant inverter is configured to receive the first inverted signal at the second node and output a second inverted signal at a third node; and forming one or more active transistors as a second delay cell, wherein, relative to a first direction:

the first and second dummy groups and the first and second delay cells are formed in a first row that extends in the first direction, the first row including at least the first dummy group, the first delay cell, the second delay cell, and the second dummy group in the stated order; and the first and second delay cells are free from having another dummy group therebetween.

7. The method of claim 6, wherein forming the dummy transistors of the first and second dummy groups and forming the active transistors of the first and second delay cells includes:

forming a first active region that extends in the first direction;

forming a second active region that extends in the first direction and is spaced apart from the first active region in a second direction perpendicular to the first direction;

forming a plurality of conductive gate lines each extending in the second direction and crossing the first and second and second active regions, the plurality of conductive gate lines including at least one conductive gate line in the first dummy group and at least one conductive gate line in the second dummy group; and forming a first isolation dummy gate between the first dummy group and the first delay cell, and forming a second isolation dummy gate between the second delay cell and the second dummy group, the first and second isolation dummy gates extending in the second direction and crossing the first and second active regions.

8. The method of claim 7, wherein the first and second isolation dummy gates are formed to include a dielectric material that extends in the second direction and crosses the first and second active regions.

9. The method of claim 7, wherein the first and second isolation dummy gates are formed as first and second CPODE structures, the method further comprising:

forming a third CPODE structure at a first end of the first row, such that the first dummy group is between the first and third CPODE structures; and forming a fourth CPODE structure at a second end of the first row, such that the second dummy group is between the second and fourth CPODE structures.

10. The method of claim 6, wherein forming the dummy transistors of the first and second dummy groups and forming the active transistors of the first and second delay cells includes:

forming an active region that extends in the first direction; and forming a plurality of conductive gate lines each extending in a second direction, perpendicular to the first direction, and crossing the active region, the plurality of conductive gate lines including at least one conductive gate line in each of first dummy group, the second dummy group, the first delay cell, and the second delay cell.

11. The method of claim 10, further comprising forming metal-to-S/D (MD) contact structures, wherein:

the MD contact structures are formed in the first and second delay cells, and the first and second dummy groups are formed to be free of the MD contact structures.

12. The method of claim 6, wherein, in the first delay cell, the basic inverter is formed to include a pair of N-type and P-type active transistors coupled in series, and the float-resistant inverter is formed to include two N-type active transistors coupled in series and two P-type active transistors coupled in series.

13. The method of claim 12, wherein, in the float-resistant inverter, an electrical connection is formed to link a first node between the two N-type active transistors with a second node between the two P-type active transistors.

14. A method of forming a semiconductor device, the method comprising:

forming a first row of transistors that extends in a first direction on a semiconductor substrate, the first row of transistors including dummy transistors and active transistors, wherein:

the first row includes, in a sequence from a first end to a second end of the first row, at least a first dummy group, a first delay cell, a second delay cell, and a second dummy group;

the first dummy group is formed of one or more dummy transistors;

the second dummy group is formed of one or more dummy transistors;

the first delay cell is formed of active transistors configured as:

a basic inverter operable to output a first inverted signal in response to receiving a first input signal; and a float-resistant inverter operable to output a second inverted signal in response to receiving the first inverted signal;

the second delay cell is formed of active transistors configured as at least one inverter; and the first row is free of dummy transistors between the first delay cell and the second delay cell.

15. The method of claim 14, comprising:

forming active regions, including doping areas of a substrate;

forming source/drain (S/D) regions, including doping first areas of the active regions that represent first transistor-components with a result that second areas of the active regions between corresponding ones of the first areas are channel regions representing second transistor-components;

forming gate lines representing third transistor-components over corresponding ones of the channel regions;

forming metal-to-S/D (MD) contact structures representing fourth transistor-components over corresponding ones of the S/D regions, the MD contact structures defining:

a first set of the first to fourth transistor-components that lack connections to the first and third transistor-components which otherwise would be indicative of configurations as active transistors such that the first to fourth transistor-components of the first set represent the one or more dummy transistors of the first dummy group; and a second set of the first to fourth transistor-components that lack connections to the first and third transistor-components which otherwise would be indicative of configurations as active transistors such that the first to fourth transistor-components of the second set represent the one or more dummy transistors of the second dummy group; and forming interconnection structures representing fifth transistor-components over corresponding ones of the gate lines and the MD contact structures, the interconnection structures defining:

a third set of the first to fifth transistor-components connected as the active transistors of the first delay cell; and a fourth set of the first to fifth transistor-components connected as the active transistors of the second delay cell.

16. The method of claim 15, wherein:

the forming interconnection structures further defines:

a batch of N sets of the first to fifth transistor-components connected as corresponding active transistors that define a batch of N delay cells, where N is a positive integer;

the batch of N delay cells is in the first row; and relative to the first direction, the sequence includes the first dummy group, the first delay cell, the batch of N delay cells, the second delay cell, and the second dummy group, in which any two of the first and second delay cells and delay cells of the batch of N delay cells are free from having another dummy group being therebetween.

17. The method of claim 14, further comprising forming N delay cells in the first row, where N is a positive integer, such that, relative to the first direction, the sequence includes the first dummy group, the first delay cell, the N delay cells, the second delay cell, and the second dummy group, the sequence being arranged such that any two of the first and second delay cells and delay cells of the N delay cells are free from having another dummy group being therebetween.

18. The method of claim 14, wherein forming the first row of transistors includes:

forming a first active region that extends in the first direction;

forming a second active region that extends in the first direction and is spaced apart from the first active region in a second direction perpendicular to the first direction;

forming a plurality of conductive gate lines each extending in the second direction and crossing the first and second and second active regions, the plurality of conductive gate lines including at least one conductive gate line in the first dummy group and at least one conductive gate line in the second dummy group; and forming a first isolation dummy gate between the first dummy group and the first delay cell, and forming a second isolation dummy gate between the second delay cell and the second dummy group, the first and second isolation dummy gates extending in the second direction and crossing the first and second active regions.

19. The method of claim 14, wherein, in the first delay cell, the basic inverter is formed to include a pair of N-type and P-type active transistors coupled in series, and the float-resistant inverter is formed to include two N-type active transistors coupled in series and two P-type active transistors coupled in series.

20. The method of claim 19, wherein, in the float-resistant inverter, an electrical connection is formed to link a first node between the two N-type active transistors with a second node between the two P-type active transistors.

* * * * *